(12) United States Patent
Shigeoka et al.

(10) Patent No.: US 6,876,816 B2
(45) Date of Patent: Apr. 5, 2005

(54) HEATING DEVICE, HEAT TREATMENT APPARATUS HAVING THE HEATING DEVICE AND METHOD FOR CONTROLLING HEAT TREATMENT

(75) Inventors: Takashi Shigeoka, Nirasaki (JP); Takeshi Sakuma, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/451,914

(22) PCT Filed: Dec. 27, 2001

(86) PCT No.: PCT/JP01/11595

§ 371 (c)(1),
(2), (4) Date: Jan. 5, 2004

(87) PCT Pub. No.: WO02/054452

PCT Pub. Date: Jul. 11, 2002

(65) Prior Publication Data

US 2004/0112885 A1 Jun. 17, 2004

(30) Foreign Application Priority Data

Dec. 28, 2000 (JP) ........................................ 2000-400199

(51) Int. Cl.[7] .................................................. F26B 3/30
(52) U.S. Cl. ....................... 392/411; 392/416; 392/418; 219/390; 219/405; 219/411; 118/724; 118/725; 118/50.1
(58) Field of Search ................................ 219/390, 405, 219/411; 118/724, 725, 50.1, 411; 392/416, 418

(56) References Cited

U.S. PATENT DOCUMENTS

| | | |
|---|---|---|
| 4,857,704 A | 8/1989 | Jannot et al. |
| 5,427,620 A | 6/1995 | DeBoer et al. |
| 5,951,896 A | 9/1999 | Mahawili |
| 6,122,440 A | 9/2000 | Campbell |
| 6,156,079 A * | 12/2000 | Ho et al. ................... 29/25.01 |
| 6,310,328 B1 * | 10/2001 | Gat .............................. 219/411 |

FOREIGN PATENT DOCUMENTS

| | | |
|---|---|---|
| EP | 0374511 | 6/1990 |
| EP | 0848575 | 6/1998 |
| JP | 2001210604 | 3/2001 |
| WO | 00/34986 | 6/2000 |

* cited by examiner

*Primary Examiner*—Shawntina Fuqua
(74) *Attorney, Agent, or Firm*—Crowell & Moring LLP

(57) ABSTRACT

A heat treatment apparatus achieves a uniform and rapid temperature rise of an object to be processed. A plurality of double-end lamps heat the object to be processed so as to apply a heat treatment process to the object. A plurality of reflectors reflect radiation heat of the double-end lamps toward the object to be processed. Each of the double-end lamps includes a rectilinear light-emitting part and at least two double-end lamps among the plurality of double-end lamps are arranged along a longitudinal direction of the light-emitting part, or each of the double-end lamps includes a rectilinear light-emitting part and the plurality of double-end lamps are arranged so that the light-emitting parts are parallel to each other and positioned in at least two stages.

29 Claims, 28 Drawing Sheets

α correct equation (D1/D2=0.4)

1-α correct equation (d1/d2=0.8)

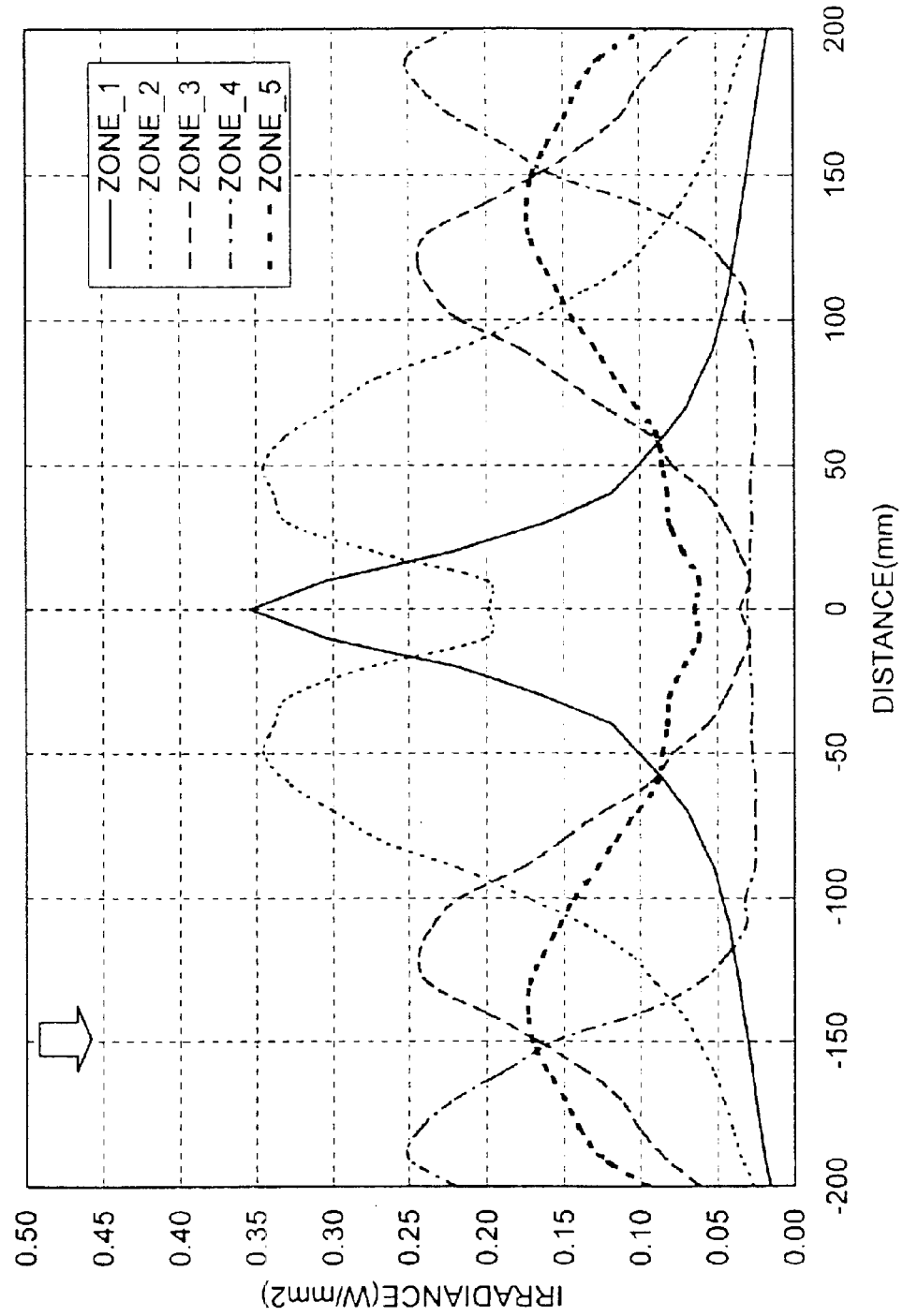

US 6,876,816 B2

HEATING DEVICE, HEAT TREATMENT APPARATUS HAVING THE HEATING DEVICE AND METHOD FOR CONTROLLING HEAT TREATMENT

TECHNICAL FIELD

The present invention generally relates to a heating device, a heat treatment apparatuses having the heating device and a heat treatment controlling method for applying a heating process to an object to be processed such as a single crystal substrate or a glass substrate. The present invention is suitable for a rapid thermal processing (RTP: Rapid Thermal Processing) used for manufacturing semiconductor devices, such as a memory or an integrated circuit (IC). The rapid thermal processing (RTP) includes rapid thermal annealing (RTA), rapid thermal cleaning (RTC), rapid thermal chemical vapor deposition (RTCVD), rapid thermal oxidization (RTO) and rapid thermal nitriding (RTN).

BACKGROUND ART

Generally, in order to manufacture a semiconductor integrated circuit, various kinds of heat treatment, such as a film deposition process, an anneal process, an oxidization diffusion process, a sputtering process, an etching process and a nitriding process may be repeatedly performed on a silicon substrate such as a semiconductor wafer a plurality of times.

Since yield rate and quality of semiconductor manufacturing processes can be improved, the RTP technology to rise and drop the temperature of the wafer (object to be processed) has attracted attention. A conventional RTP apparatus generally comprises: a support ring (may be referred to as a guard ring, a heat uniforming ring, etc.) on which an object (for example, a semiconductor wafer, a glass substrate for photograph masks, a glass substrate for a liquid-crystal display or a substrate for optical discs) to be processed is placed; a single-wafer chamber (process chamber) for accommodating those parts; a quartz window disposed in the process chamber; heating lamps (for example, halogen lamps) arranged above or above and under the quartz window; and a reflector (reflective board) arranged at the opposite side of the object to be processed with respect to the quartz window.

The reflector is made of aluminum, for example, and gold plating is typically given to a reflective part thereof. A cooling mechanism (a cooling pipe, etc.) is provided so as to prevent temperature breakage of the reflector (for example, exfoliation of gold plating due to a high temperature) and also to prevent the reflector from being an obstacle of cooling the object to be processed at the time of cooling.

The quartz window may be in the shape of a board. When a negative pressure environment in the process chamber is maintained by evacuating gasses in the process chamber by a vacuum pump, the board-like quartz window has a thickness of several tens millimeters (for example, 30 to 40 mm) so as to maintain the pressure difference between the internal pressure and the atmospheric pressure. The quartz window may be formed in a pressure-resistant curved shape having a reduced thickness so as to prevent generation of a thermal stress due to temperature difference generated by a temperature rise.

A plurality of halogen lamps are arranged so as to uniformly heat the object to be processed, and the reflector reflects the infrared rays irradiated from the halogen lamps toward the object to be processed. In recent years, a demand for a rapid temperature rise (doe example, more than 100° C./sec) of RTP has been increased so as to achieve a high-quality process of an object to be processed and improve a throughput. The temperature rising rate depends on a power density of a lamp and a directivity of light irradiation from the lamp to an object to be processed. Here, the halogen lamp can be generally classified into a single-end lamp having a single electrode and a double-end lamp having two electrodes (such as a fluorescent lamp).

The single-end lamp has a light-emitting part extending vertically to an object to be processed, and the directivity and the energy efficiency thereof are maximized with respect to the object to be processed located underneath in a case of a single end lamp 2 having a single electrode part 3 like a bulb when a degree of an angle α of inclination of a reflector 4 relative to the lamp 2 is set to 45 degrees as shown in FIG. 1. Here, FIG. 1 is an illustration for explaining the inclination angle of the reflector 4 when the directivity and the energy efficiency are maximized in a case in which an object to be processed underneath is heated by a radiation light of the single end lamp 2. However, if the reflector 4 having an inclination angle of 45 degrees is provided around each of a plurality of lamps 2, the lamps cannot be arranged closed to each other, which causes a decrease in the power density. Thus the inventors considered to achieve a rapid temperature rise as a whole by increasing the lamp density by setting the inclination angle greater than 45 degrees as shown in FIG. 2 so as to set the inclination angle equal to or close to 90 degrees while slightly sacrificing the directivity and energy efficiency. However, it was found that, in such a structure, the light emitted from a middle portion 2a of the lamp 2 (filament) is reflected by the reflector 4a many times until the light is irradiated onto the object to be processed, and, thus, the efficiency of the energy irradiated onto the object to be processed is reduced to 40%.

On the other hand, the double-end lamp has a lower cost than the single-end lamp, and is superior to the single-end lamp in economical efficiency. Moreover, since the double-end lamp can be arranged parallel to the object to be processed as shown in FIG. 3, the radiation light can reach the object to be processed with less number of times of reflection than the single-end lamp by arranging the reflector above the lamp, and, thus, the energy efficiency reaches 60% which is higher than that of the single-end lamp. However, as disclosed in U.S. Pat. Nos. 5,951,896 and 4,857,704 and Japanese Patent Publication No. 5-42135 and Japanese Laid-Open Patent Application No. 2001-210604, the conventional technique attempts uniform irradiation to the object to be processed by arranging a plurality of sets of double-end lamps in multiple stages so that the light-emitting parts intersect with each other, a plurality of bar type double-end lamps being arranged in parallel in the same plane without using reflectors.

The process chamber is typically connected to a gate valve on a sidewall thereof so as to carry in and out the object to be processed, and is also connected to a gas supply nozzle at the sidewall for introducing a process gas used for heat treatment.

Since the temperature of the object to be processed affects the quality of process (for example, a thickness of a film in a film deposition process, etc), it is necessary to know the correct temperature of the object to be processed. In order to attain high-speed heating and high-speed cooling, a temperature measuring device which measures the temperature of the object to be processed is provided in the process chamber. Although the temperature measuring device can be constituted by a thermocouple, there is a possibility that the processed body is polluted with the metal which constitutes the thermocouple since it is necessary to bring the thermocouple into contact with the object to be processed. Therefore, there is proposed a payrometer as a temperature measuring device which detects an infrared intensity emitted and computes a temperature of an object to be processed from the back side thereof based on the detected infrared intensity. The payrometer computes the temperature of the object to be processed by carrying out a temperature conversion by an emissivity of the object to be processed according to the following expression:

$$E_m(T)=\epsilon E_{BB}(T) \tag{1}$$

where, $E_{BB}(T)$ expresses a radiation intensity from a black body having the temperature T; $E_m(T)$ expresses a radiation intensity measured from the object to be processed having the temperature T; $\epsilon$ expresses a rate of radiation of the object to be processed.

In operation, the object to be processed is introduced into the process chamber through the gate valve, and the peripheral portion of the object to be processed is supported by a holder. At the time of heat treatment, process gases such as nitrogen gas and oxygen gas, are introduced into the process chamber through the gas supply nozzle. On the other hand, the infrared ray irradiated from the halogen lamps is absorbed by the object to be processed, thereby, raising the temperature of the object to be processed.

However, although the support ring, on which an object to be processed (foe example, a silicon substrate) is placed, is formed of ceramics (for example, SiC) having excellent heat resistance, there is a difference in temperature rise of both parts due to a difference in heat capacity. Thus, the temperature rising rate of the object to be processed at a periphery thereof is smaller than that of the center. Such an influence has become remarkable as rapid temperature rise has been improved recently. In other words, in order to raise a temperature quickly and uniformly over the entire surface of the object to be processed, there is a problem that a mere uniform irradiation to the object to be processed is insufficient.

As a means for solving such a problem, the inventors considered a temperature control system in which temperatures of the center and the periphery of the object to be processed are measured so as to partially turn on the lamps so as to raise the temperature of only the periphery when the temperature of the periphery is lower than the center. However, the conventional arrangement of the double-end lamps disclosed in the above-mentioned patent documents has an object to uniformly irradiate the object to be processed, and it is not an object to irradiate partially an arbitrary part of the object to be processed. Thus, the arrangement of the lamps in the patent documents has difficulty in temperature controlling, and the center of the object to be processed is heated even if an attempt is made to heat only the periphery of the object to be processed. Additionally, since a reflector is not used (or cannot be used) in the arrangement of the lamps disclosed in the patent documents, the energy efficiency is low, and a service life of the lamps is shortened if a high voltage if applied to the lamps so as to maintain a power.

DISCLOSURE OF INVENTION

It is a general object of the present invention to provide a novel and useful heating device, heat treatment apparatus having the heating device and method for controlling a heat treatment in which the above-mentioned problems are eliminated.

A more specific object of the present invention is to provide a heating device, heat treatment apparatus having the heating device and method for controlling a heat treatment, which achieves a uniform and rapid temperature rise of an object to be processed.

In order to achieve the above-mentioned objects, there is provided according to one aspect of the present invention a heating device for heating an object to be processed, comprising: a plurality of double-end lamps for heating the object to be processed so as to apply a heat treatment process to the object; a plurality of reflectors reflecting radiation heat of the double-end lamps toward the object to be processed, wherein each of the double-end lamps includes a rectilinear light-emitting part and at least two double-end lamps among the plurality of double-end lamps are arranged along a longitudinal direction of the light-emitting part.

According to the above-mentioned invention, since the object to be processed is heated by a plurality of double-end lamps along a longitudinal direction of the light-emitting part, a fine temperature control of the object to be processed can be achieved by, for example, electively turning on a part of the double-end lamps or supplying a different power to a part of the double-end lamps. Additionally, a power supplied to each double-end lamp can be reduced as compared to a structure in which a single double-end lamp is arranged in a longitudinal direction of the light-emitting part.

Additionally, there is provided according to another aspect of the present invention a heating device for heating to an object to be processed, comprising: a plurality of double-end lamps for heating the object to be processed so as to apply a heat treatment process to the object; and a plurality of reflectors reflecting radiation heat of the double-end lamps toward the object to be processed, wherein each of the double-end lamps includes a rectilinear light-emitting part and the plurality of double-end lamps are arranged so that the light-emitting parts are parallel to each other and positioned in at least two stages.

According to the above-mentioned invention, since the object to be processed is heated by a plurality of double-end lamps along a longitudinal direction of the light-emitting part, a fine temperature control of the object to be processed can be achieved by, for example, electively turning on a part of the double-end lamps or supplying a different power to a part of the double-end lamps. Additionally, a power supplied to each double-end lamp can be reduced as compared to a structure in which a single double-end lamp is arranged in a longitudinal direction of the light-emitting part. Further, the heating of the object to be processed can be performed with a high power since the double-end lamps are arranged in tow stages (upper and lower stages) and the reflectors are provided to the double-end lamps to reflect the light toward the object to be processed.

In the heating device according to the present invention, the object to be processed and the double-end lamps may be relatively rotatable to each other so that the entire object to be processed is heated uniformly.

Additionally, there is provided according to another aspect of the present invention a heat treatment apparatus for applying a heat treatment process to an object to be processed, comprising: a plurality of double-end lamps for heating the object to be processed so as to apply the heat treatment process to the object; a plurality of reflectors reflecting radiation heat of the double-end lamps toward the object to be processed, wherein each of the double-end lamps includes a rectilinear light-emitting part and at least two double-end lamps among the plurality of double-end lamps are arranged along a longitudinal direction of the light-emitting part.

According to the heat treatment apparatus of the above-mentioned invention, since the object to be processed is heated by a plurality of double-end lamps along a longitudinal direction of the light-emitting part, a fine temperature control of-the object to be processed can be achieved by, for example, electively turning on a part of the double-end lamps or supplying a different power to a part of the double-end lamps. Additionally, a power supplied to each double-end lamp can be reduced as compared to a structure in which a single double-end lamp is arranged in a longitudinal direction of the light-emitting part.

Additionally, there is provided according to another aspect of the present invention a heat treatment apparatus for applying a heat treatment process to an object to be processed, comprising: a plurality of double-end lamps for heating the object to be processed so as to apply the heat treatment process to the object; and a plurality of reflectors reflecting radiation heat of the double-end lamps toward the object to be processed, wherein each of the double-end lamps includes a rectilinear light-emitting part and the plurality of double-end lamps are arranged so that the light-emitting parts are parallel to each other and positioned in at least two stages.

According to the heat treatment apparatus of the above-mentioned invention, since the object to be processed is heated by a plurality of double-end lamps along a longitudinal direction of the light-emitting part, a fine temperature control of the object to be processed can be achieved by, for example, electively turning on a part of the double-end lamps or supplying a different power to a part of the double-end lamps. Additionally, a power supplied to each double-end lamp can be reduced as compared to a structure in which a single double-end lamp is arranged in a longitudinal direction of the light-emitting part. Further, the heating of the object to be processed can be performed with a high power since the double-end lamps are arranged in tow stages (upper and lower stages) and the reflectors are provided to the double-end lamps to reflect the light toward the object to be processed.

In the heat treatment apparatus according to the present invention, the object to be processed and the double-end lamps may be are relatively rotatable to each other so that the object to be processed is heated uniformly.

Additionally, the heat treatment apparatus according to the present invention may further comprise: a process chamber for accommodating an object to be processed so as to apply a heat treatment process to the object; a support member supporting the object to be processed within the process chamber, the support member contacts a part of the object to be processed; a temperature measuring device measuring a temperature of the object to be processed; and a control unit connected to the heating unit and the temperature measuring device, wherein the heating unit may comprise: the plurality of double-end lamps for heating the object to be processed; and the plurality of reflectors reflecting radiation heat of the double-end lamps toward the object to be processed, wherein the control unit controls outputs of the double-end lamps based on a result of measurement of the temperature measuring device and an illuminance distribution characteristic produced by arbitrarily combining illuminance distributions of the double-end lamps so as to raise a temperature of the entire object uniformly.

Accordingly, the control unit controls the power supplied to the double-end lamps by utilizing an illuminance distribution characteristic produced by selectively combining illuminance distribution characteristics of the double-end lamps. This enables a temperature control being performed on an individual zone basis when the object to be processed is divided in to a plurality of zones. The control unit can control the temperature of the object to be processed by turning on a part of the double-end lamps or connecting power sources having different supply voltages.

Additionally, the heat treatment apparatus according to the present invention may further comprise a quartz window located between the object to be processed and the double-end lamps, wherein the quartz window comprises a quartz plate and a lens member provided on the quartz plate, the lens member reinforcing the quartz plate and condensing a light from the heating unit toward the object to be processed.

Additionally, there is provided according to another aspect of the present invention a method for controlling heat treatment applied to an object to be processed, comprising the steps of: producing a first illuminance distribution characteristic having a maximum at a connection part of the object contacting a support member, which supports the object to be processed, and a minimum on the object, the first illuminance distribution characteristic being produced by combining illuminance distribution characteristic of a plurality of double-end lamps included in a heating unit for heating the object to be processed; heating the object by the heating unit; detecting a temperature distribution of the object to be processed and the support member; and controlling outputs of the double-end lamps corresponding to the first illuminance distribution characteristic based on a result of detection of the detecting step so as to achieve a uniform temperature rise of the object to be processed.

According to the above-mentioned invention, a temperature control of the object to be produced can be performed on an individual zone basis when the object to be processed is divided in to a plurality of zones. The control unit can control the temperature of the object to be processed by turning on a part of the double-end lamps or connecting power sources having different supply voltages.

In the method according to the present invention, the producing step may produce the first illuminance distribution characteristic so that the minimum is equal to or less than $0.17$ W/mm$^2$. The inventors found that the control of outputs of the double-end lamps corresponding to the first illuminance distribution characteristic does not influence a temperature of parts of the object to be processed other than the connection part. That is the connection part can be heated while an influence of simultaneous heating of other parts is negligible.

Additionally, in the method according to the present invention, the producing step may further produce a second illuminance distribution characteristic having a maximum on the object to be processed and a minimum at a part of the object to be processed above the support member, and the controlling step controls the outputs of the double-end lamps corresponding to the second illuminance distribution characteristic when a temperature of the connecting part of the object is different from a temperature of other parts of the object to be processed. Accordingly, even if the outputs of the double-end lamps corresponding to the second characteristic is controlled, an influence that the connection part is simultaneously heated can be reduced.

Additionally, in the method according to the present invention, the producing step may further produce a third illuminance distribution characteristic having a maximum at the connection part of the object, and the controlling step controls the outputs of the double-end lamps corresponding to the third illuminance distribution characteristic. Accordingly, the connection part can be selectively heated by controlling the outputs of the double-end lamps corresponding to the third illuminance distribution characteristic, which contributes to uniform heating of the object to be processed.

Other objects, features and advantages of the present invention will become more apparent from the following detailed description when read in conjunction with the accompanying drawings.

BRIEF DESCRIPTION OF DRAWINGS

FIGS. 29 through 33 are graphs showing illuminance distribution used for the heat treatment controlling method shown in FIG. 28.

BEST MODE FOR CARRYING OUT THE INVENTION

Figure 1:
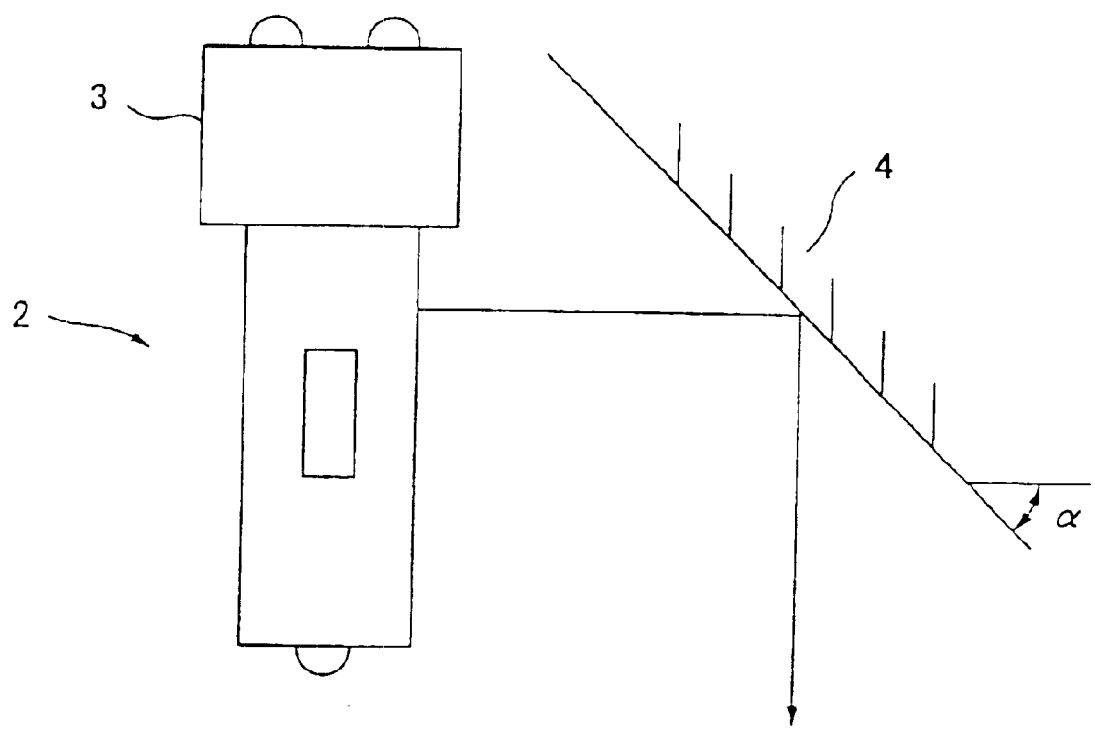
FIG. 1 is an illustration for explaining an inclination angle of a reflector when a directivity and energy efficiency are maximized in a case in which an object to be processed underneath is heated by a radiation light of a single-end lamp.
Figure 2:
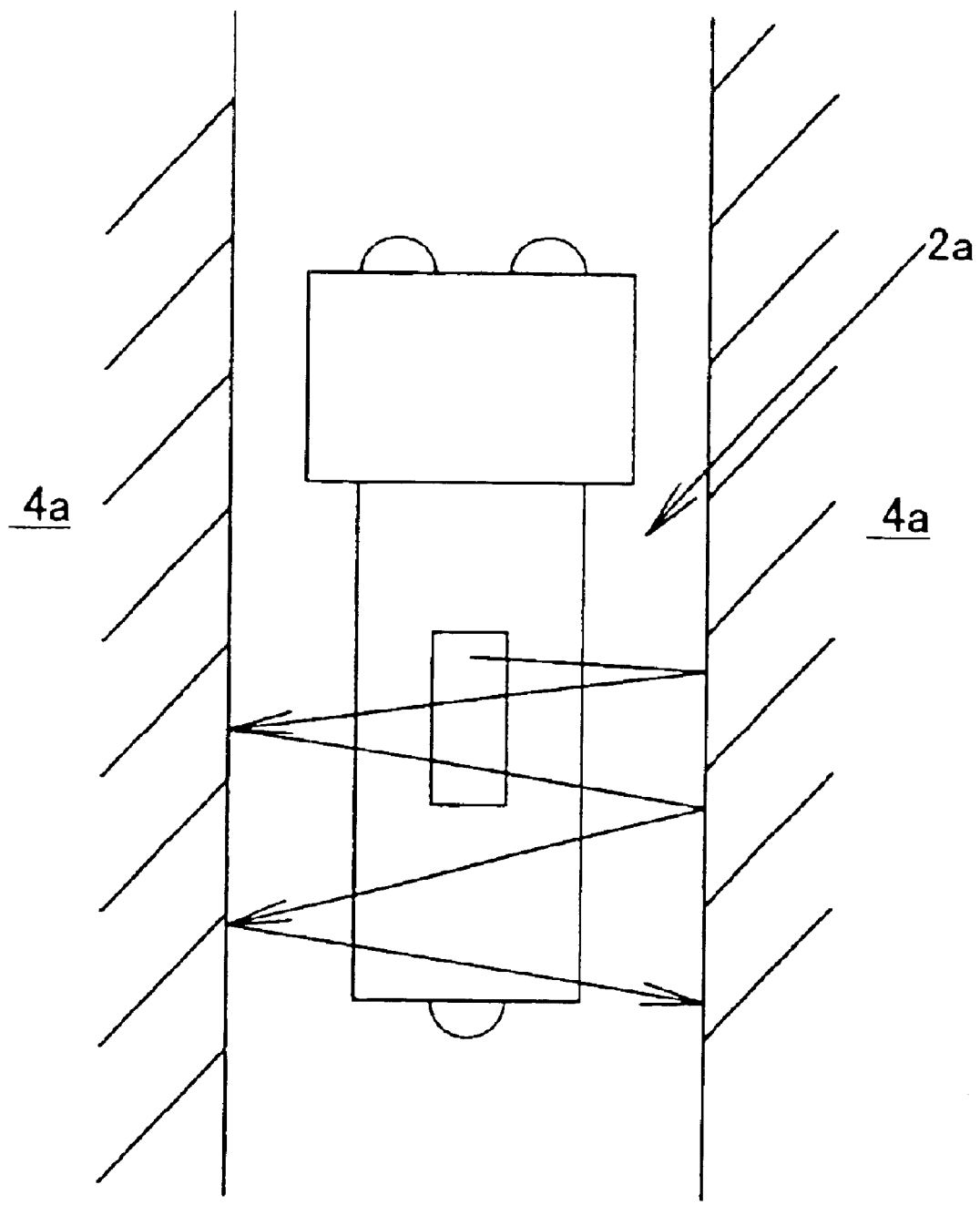
FIG. 2 is an illustration for explaining reflection of a light in a case in which the reflector shown in FIG. 1 is set perpendicular.
Figure 3:
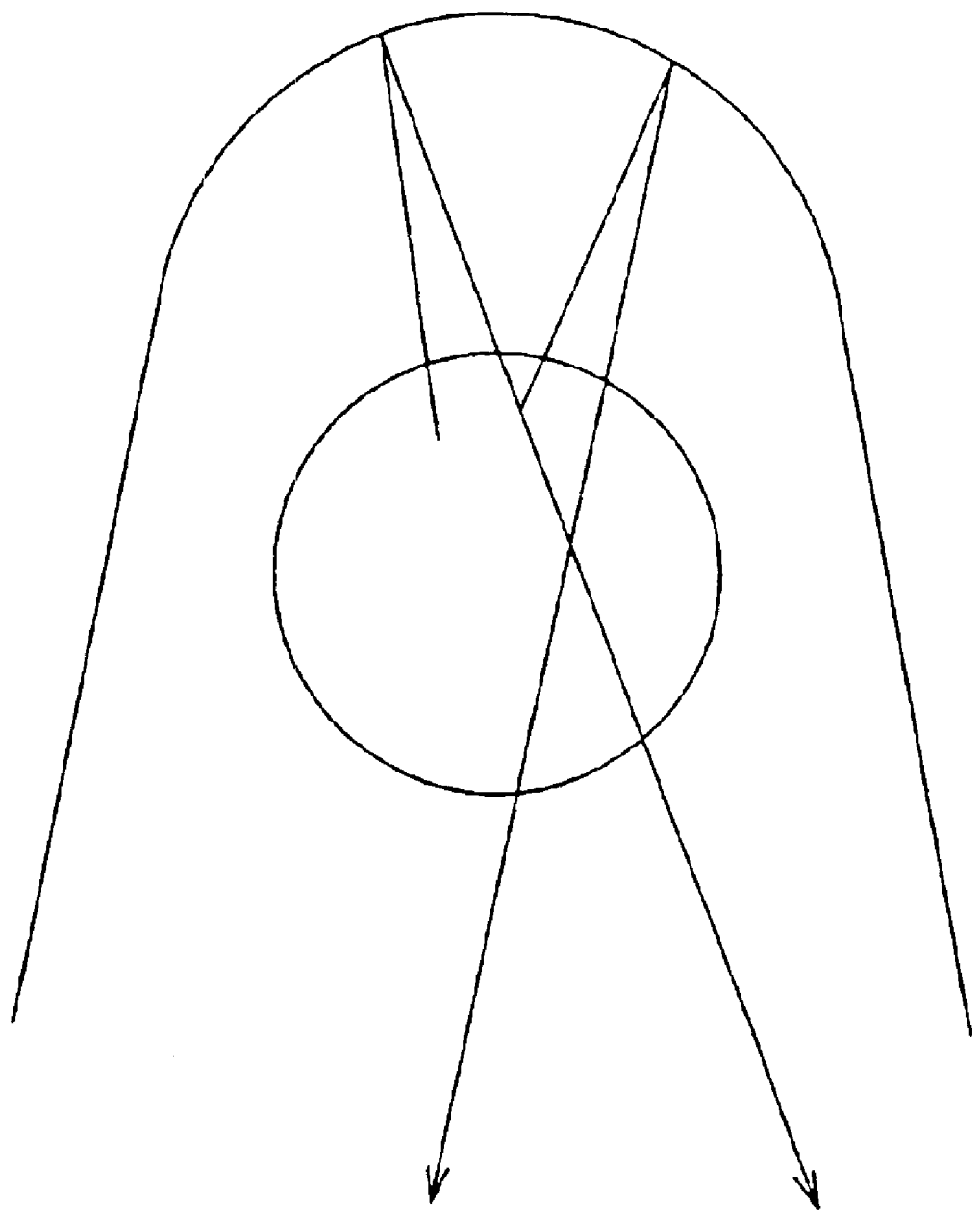
FIG. 3 is an illustration for explaining a light emitted by a double-end lamp and reflected by a reflector.
Figure 4:
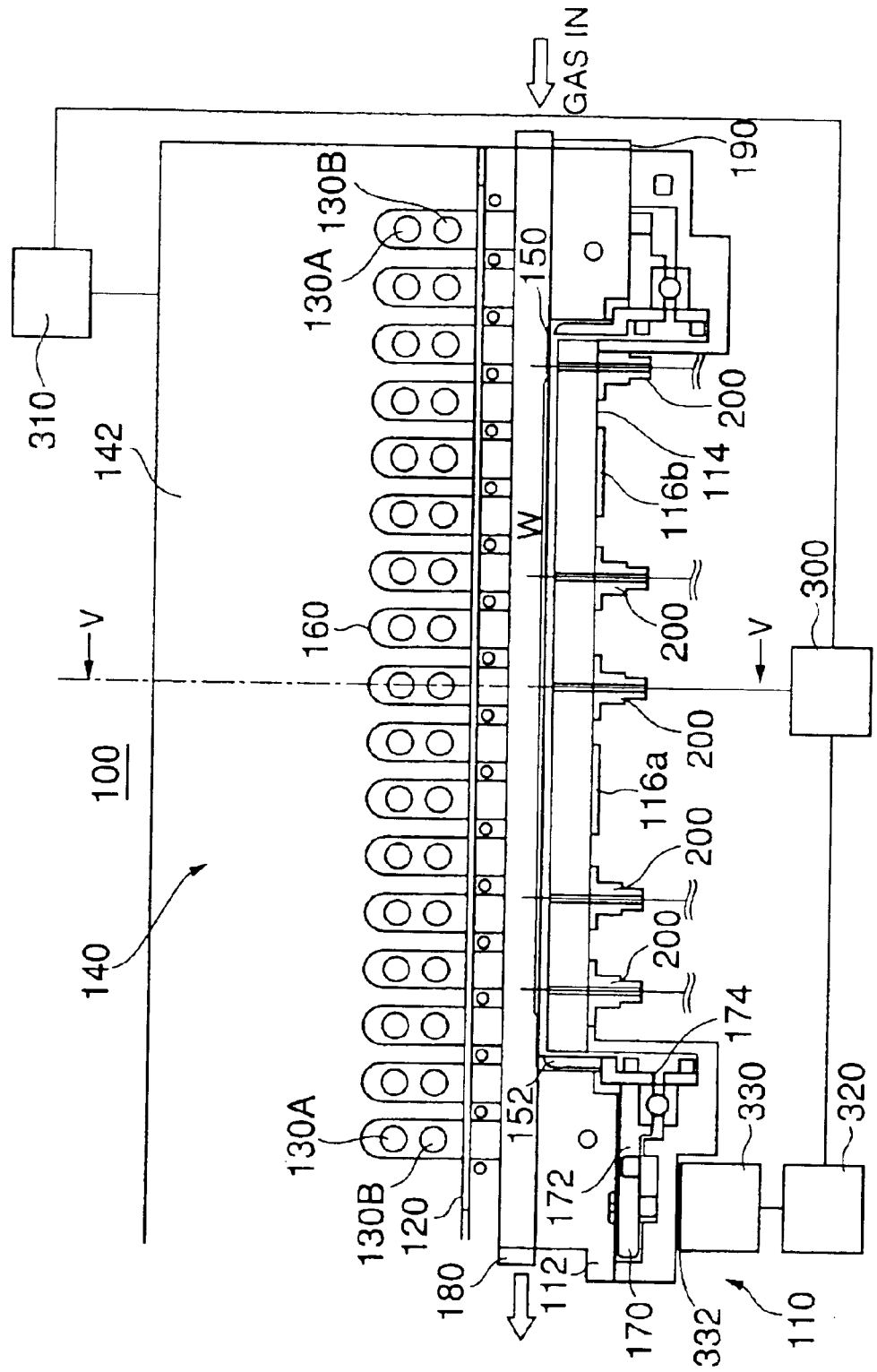
FIG. 4 is a cross-sectional view of a heat treatment apparatus according to a first embodiment of the present invention.
Figure 5:
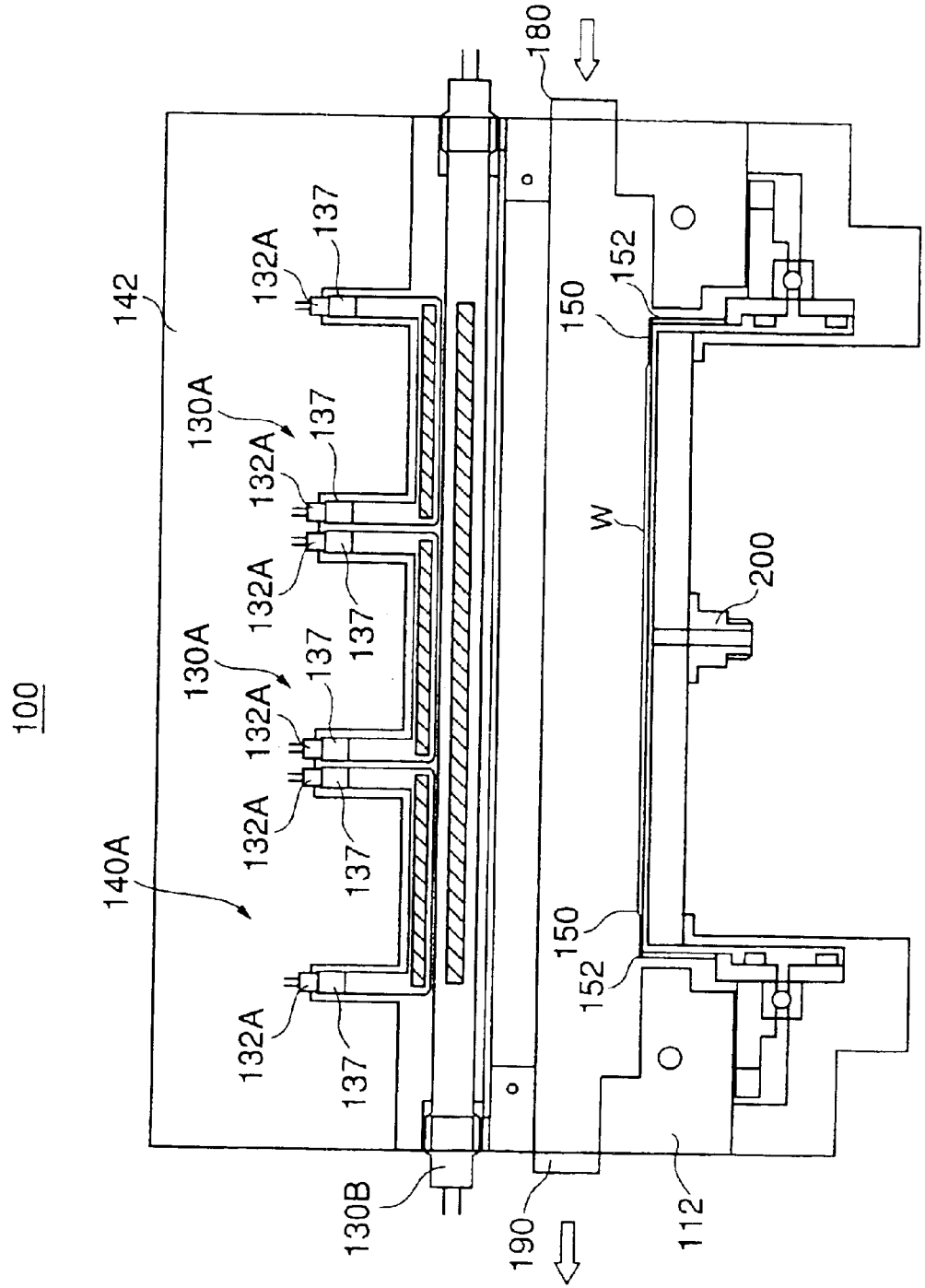
FIG. 5 is a cross-sectional view of the heat treatment apparatus-taken along a line V—V of FIG. 4.

A description will now be given of a first embodiment of the present invention. FIG. 4 is a cross-sectional view of a heat treatment apparatus 100 according to the first embodiment of the present invention. FIG. 5 is a cross-sectional view of the heat treatment apparatus taken along a line V—V of FIG. 4. As shown in FIG. 4, the heat treatment apparatus 100 generally comprises a process chamber 110, a quartz window 120, a heating unit 140, a support ring 150, a gas introducing part 180, an exhausting part 190, a radiation thermometer 200 and a control part 300.

The process chamber 110 is formed of, for example, stainless steel or aluminum, and is connected to the quartz window 120. The sidewall of the process chamber 110 and the quartz window 12 define a process space in which an object W to be processed (semiconductor wafer: hereinafter referred to as a wafer W) is subjected to a heat treatment. The support ring 150 on which the wafer W is placed and a support part 152 connected to the support ring 150 are arranged in the process space. The process space is maintained to be a predetermined negative pressure by the exhaust part 190. The wafer W is carried in or out from the process chamber through a gate valve (not shown in the figure) provided to the sidewall of the process chamber 110.

A bottom part 114 of the process chamber 110 is connected to a cooling pipes 116a and 116b (hereinafter simply referred to as cooling pipe 116) so that the bottom part 114 serves as a cooling plate. If necessary, the cooling plate 114 may be provided with a temperature control arrangement. The temperature control arrangement may comprise a control part 300, a temperature sensor and a heater. A cooling water is supplied to the temperature control arrangement from a water supply source such as a water line. A coolant such as alcohol, gurden or flon may be used instead of the cooling water. As for the temperature sensor, a known sensor such as a PTC thermister, an infrared sensor, a thermocouple, etc. may be used. The heater can be a line heater wound on the outer surface of cooling pipe 116. The temperature of the cooling water flowing through the cooling pipe 116 can be adjusted by controlling an electric current flowing through the line heater.

Figure 6:
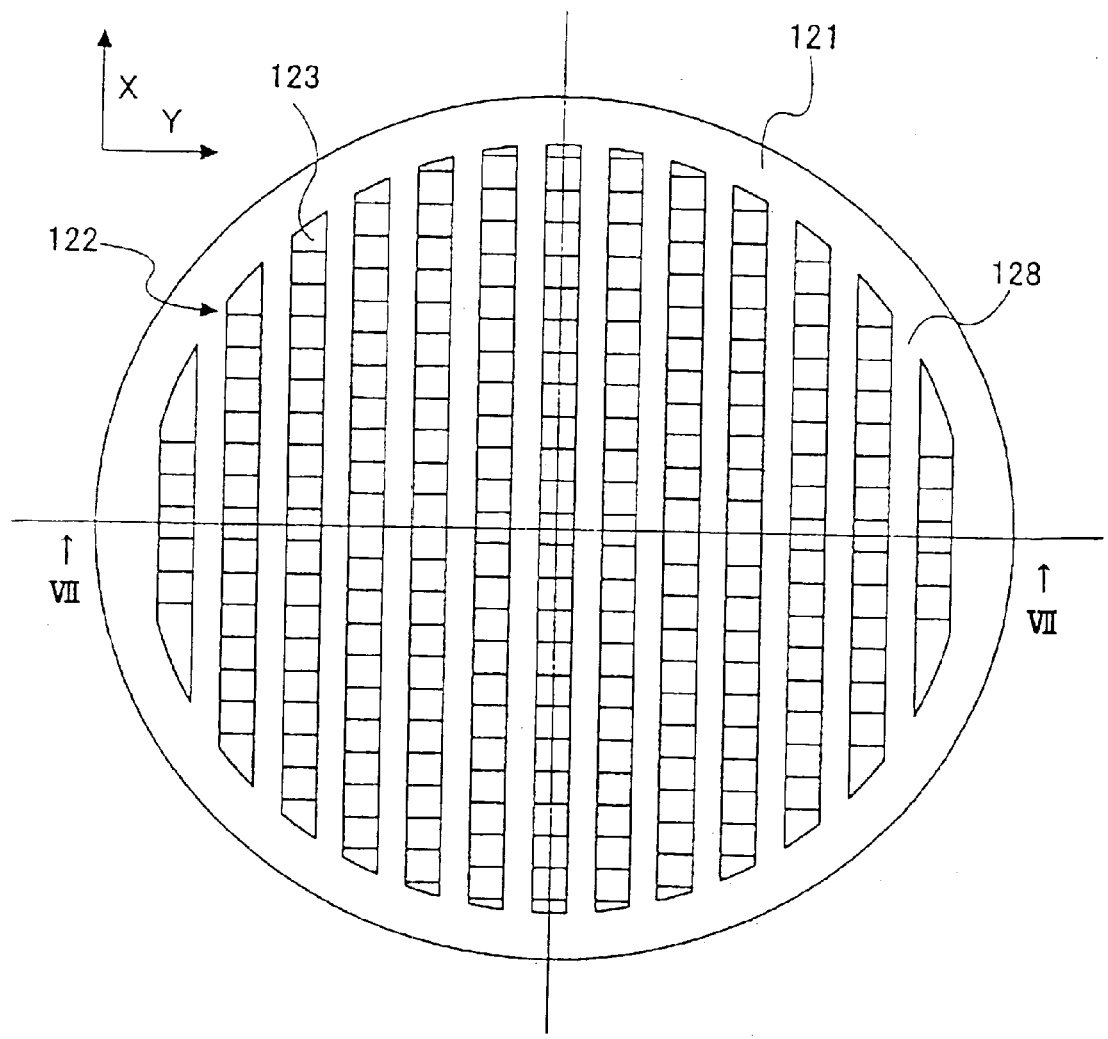
FIG. 6 is a plan view of the quartz window 120.
Figure 7:
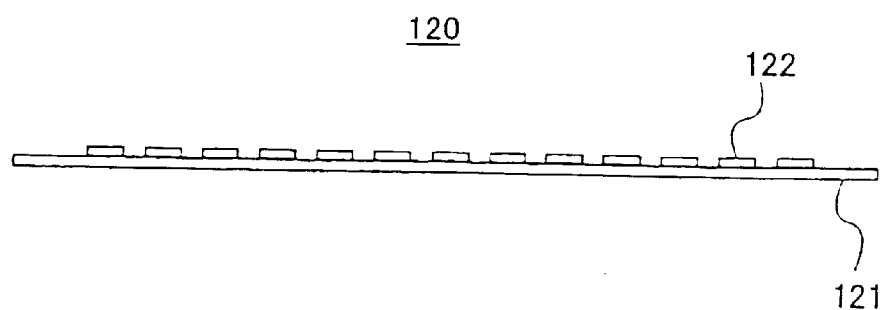
FIG. 7 is a cross-sectional view of the quartz window taken along a line VII—VII of FIG. 6.
Figure 8:
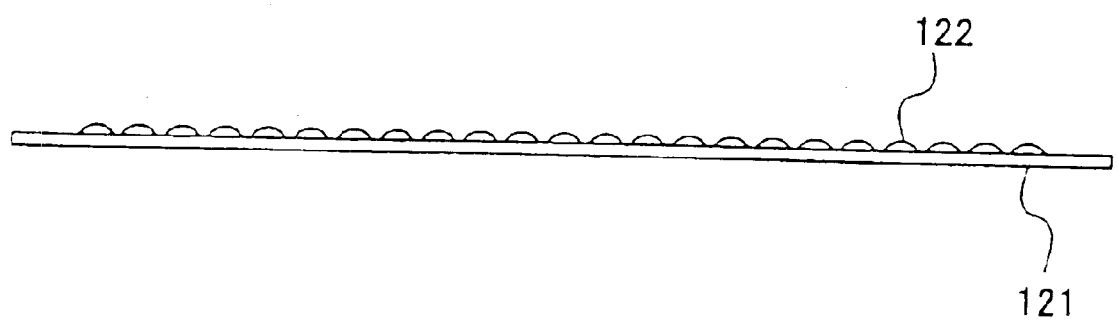
FIG. 8 is a cross-sectional view of the quartz window taken along a line V—V of FIG. 6.
Figure 9:
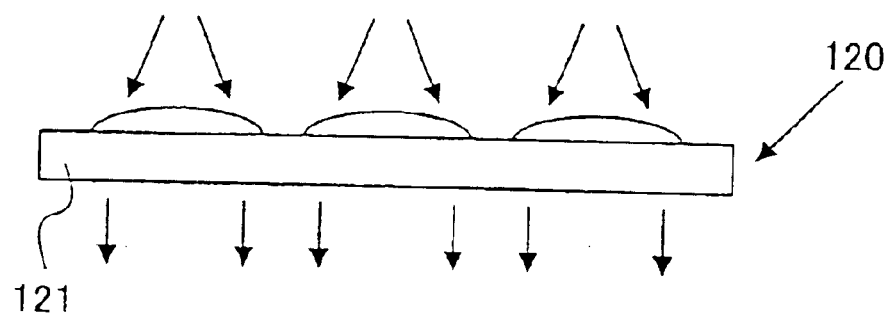
FIG. 9 is an enlarged cross-sectional view of a part of the quartz window shown in FIG. 8.
Figure 10:
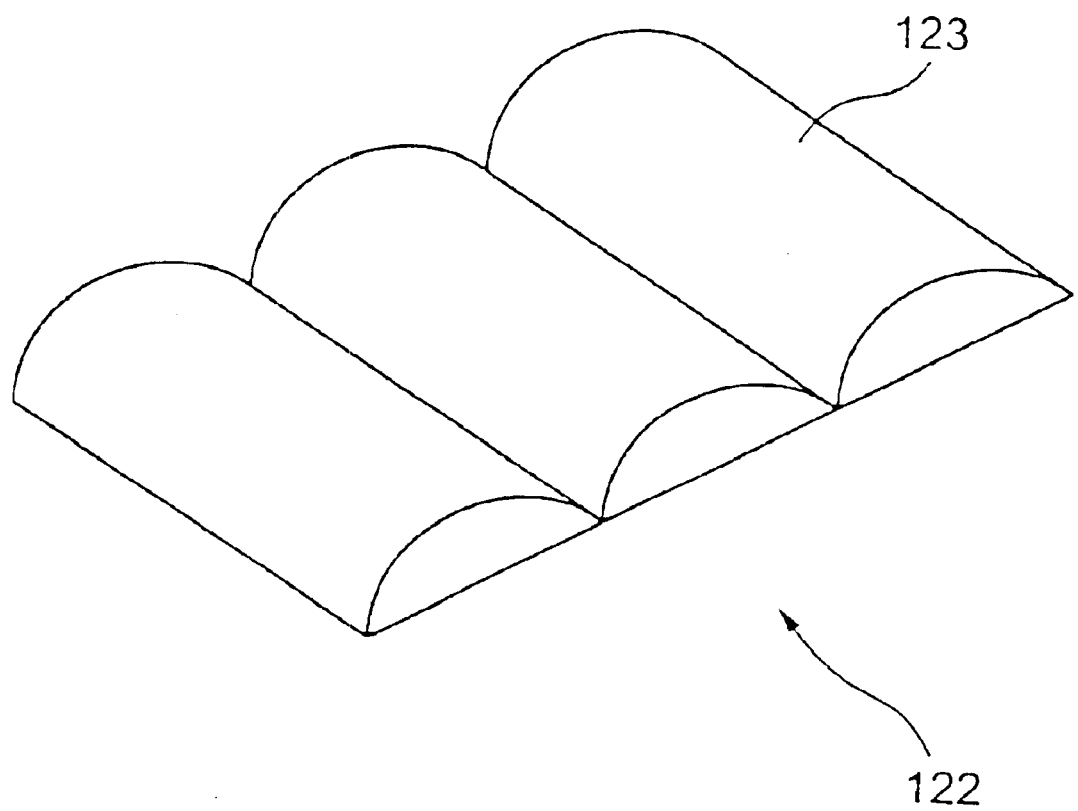
FIG. 10 is an enlarged perspective view of a part of a lens assembly used in the quartz window.

The quartz window 120 is attached to the process chamber in an airtight manner so as to maintain the negative pressure environment inside the process chamber 110 and transmit a heat radiation light emitted from lamps of the heating unit 140. As shown in FIGS. 6 through 8, the quartz window 120 comprises a cylindrical quartz plate 121 having a radius of about 400 mm and a thickness of about 33 mm and a plurality of quartz lens assembly 122 comprising a plurality of lens elements 123. FIG. 6 is a plan view of the quartz window 120. FIG. 7 is a cross-sectional view of the quartz window taken along a line VII—VII of FIG. 6. FIG. 8 is a cross-sectional view of the quartz window taken along a line V—V of FIG. 6. FIG. 9 is an enlarged cross-sectional view of a part of the quartz window shown in FIG. 8. FIG. 10 is an enlarged perspective view of a part of a lens assembly used in the quartz window.

The lens assembly 122 serves to strengthen the quartz window 120 and increase the directivity of the radiation light form the lamps of the heating unit 140. As shown in FIG. 6, each of the lens assemblies 122 has a plurality of lens elements 123 ach having a light converging action. The lens assemblies 122 are arranged parallel to the direction X since the lamps of the heating unit 140 are arranged in the direction X. That is, the direction of arrangement of the lens assemblies 122 is dependent on the direction of arrangement of the lamps of the heating unit 140. In the present embodiment, although each of the lens elements 123 is curved in the direction X, the orientation of each of the lens elements 123 is not limited to that shown in the figure, and each of the lens elements 123 may be curved in the direction X, the direction Y or both the directions X and Y. In the present embodiment, the lens assemblies 122 are arranged so as to uniformly heat the entire wafer W having a circular shape.

The lens assemblies 122 serve to provide an air passages for cooling the lens assemblies 122, the quartz window 120 and the lamps 130. Additionally, a gap between the adjacent lens assemblies 122 in a direction Y serves as a contact part 128 which contacts a separation wall 144 which cools the quartz plate 121 by heat conduction.

In the present embodiment, as described above, the thickness of the quartz plate 121 is set equal to or less than 30 mm to 40 mm, for example, about 30 mm. Although the present invention does not exclude the thickness being in the range of 30 mm to 40 mm so as to use only the light converging action of the lens assemblies 122, the use of the thin quartz plate 121 according to the present embodiment can provide an effect described later. Additionally, although the lens assemblies 122 according to the present embodiment has a height about 3 mm and a width equal to or less than 15 mm in FIG. 7, the height and width are not limited to such dimensions. Further, although the lens elements 123 according to the present embodiment has a length about 60 mm and a radius about 150 mm in FIG. 8 and FIG. 9, the length and radius are not limited to such dimensions.

In the present embodiment, although the window lens assemblies 122 are provided only on one side of the quartz plate 121 which side is opposite to the lamps 130 of the heating unit 140, the window lens assemblies 122 may be provided on both sides or on the other side which is not opposite to the lamps 130.

Since the strength with respect to thermal deformation of the quartz plate 121 is increased by the lens assemblies 122, there is no need to form the quartz plate 121 in a domal shape which curves in a direction protruding from the process chamber 110 as in the conventional apparatus. Accordingly, the quartz plate 121 has a flat shape. Since the quartz window formed in a domal shape increases a distance between the wafer W and the lamps 130 of the heating unit 140, there is a problem in that the directivity of the lamps is deteriorated. The present embodiment solves such a problem relating to the directivity of the lamps. Although the quartz plate 121 and the lens assemblies 122 are joined by welding in the present embodiment, the quartz plate 121 and the lens assemblies 122 may be joined by other methods or integrally formed with each other.

The thickness of the quartz plate 121 is about 30 mm, which is smaller than the thickness of the conventional quartz plate which ranges from 30 mm to 40 mm. Consequently, the quartz window 120 according to the present embodiment absorbs a smaller amount of the light emitted by the lamps 130 than the conventional quartz window. Thus, the quartz window 120 has the following advantages over the conventional quartz window. First, a high rate temperature rise can be achieved with a low power consumption since the irradiation efficiency of the lamps 130 to the wafer W can be improved. That is, the present embodiment solves the problem in that the lamp light is absorbed by the quartz window which results in deterioration of the irradiation efficiency. Second, the quartz window is prevented from being damaged due to a difference in temperature between the front surface and the back surface of the quartz window 121 since the difference can be maintained smaller than that of the conventional quartz window. That is, the present embodiment solves the problem in that the conventional quartz window is easily destroyed due to a difference in the thermal stress between the front surface facing the lamps and the back surface opposite to the front surface when a rapid thermal process is performed as in a rapid thermal process (RTP) apparatus. Third, the quartz window is prevented from forming a deposition film or a byproduct on a surface thereof during a film deposition process since the temperature of the quartz window 120 is lower than the conventional quartz window. Thus, a good repeatability can be maintained and a frequency of cleaning operations applied to the process chamber 110 can be decreased. That is, the present embodiment solves the problem in that the temperature of the conventional window is high especially when a film deposition process is performed, which results in deposition of a deposition film or a byproduct on the surface of the quartz window and increase in the frequency of cleaning operations of the process chamber.

Additionally, although the quartz window 120 solely constituted by the quartz plate, which does not have the lens assemblies 122, may reduce an amount of light absorbed by the quartz plate 121 when the thickness of the quartz plate 121 is small as in the present embodiment, it is possible that the quartz window 120 is easily destroyed since the quartz plate 120 cannot withstand a pressure difference between the negative pressure in the process chamber and the atmospheric pressure. Accordingly, there is a problem in that the quartz window cannot be used with a process, which must be performed under a negative pressure environment. The lens assemblies solve such a problem since the lens assemblies 122 reinforces the quartz plate 121.

Figure 11:
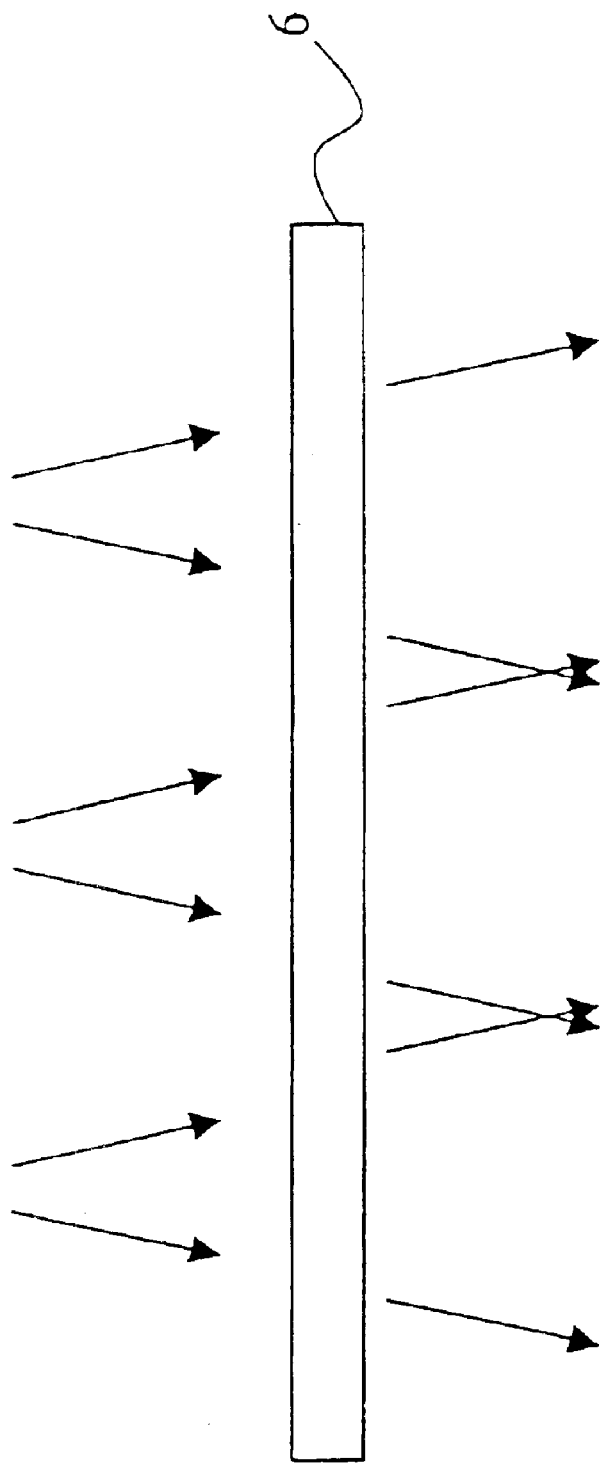
FIG. 11 is a cross-sectional view of a circular quartz window for explaining the directivity of the light passing through the circular quartz window.

A description will now be given, with reference to FIGS. 8, 9 and 11, of a light converging action of the lens assemblies 122 of the quartz window 120. FIG. 11 is a cross-sectional view of a circular quartz window for explaining the directivity of the light passing through the circular quartz window 6. Referring to FIG. 11, the light emitted from a single end lamp (not shown in the figure) positioned above the quartz window and transmitting the quartz window 6 is spread, and, thus, the directivity of the light passed through the quartz window 13 with respect to the wafer W, which is placed under the quartz window, is dull. On the other hand, as shown in FIGS. 8 and 9, the quartz window 120 according to the present embodiment collimates the light emitted from the lamps 130 by the lens assemblies 122 having the convex lens elements 123 so that the light is irradiated on the wafer W with a good directivity. It should be noted that the structure of each lens element 123 is not limited to the specifically disclosed shape and curvature which collimate the light from the lamps 130, and the lens element may provide a directivity the same as the conventional quartz window. That is, even if the directivity is the same as that of the conventional quartz window, the lens assemblies 122 have the above-mentioned reinforcing function. Additionally, in extended meaning, the heating unit 140 according to another aspect of the present invention may be combined with the quartz window 6 shown in FIG. 11.

Figure 12:
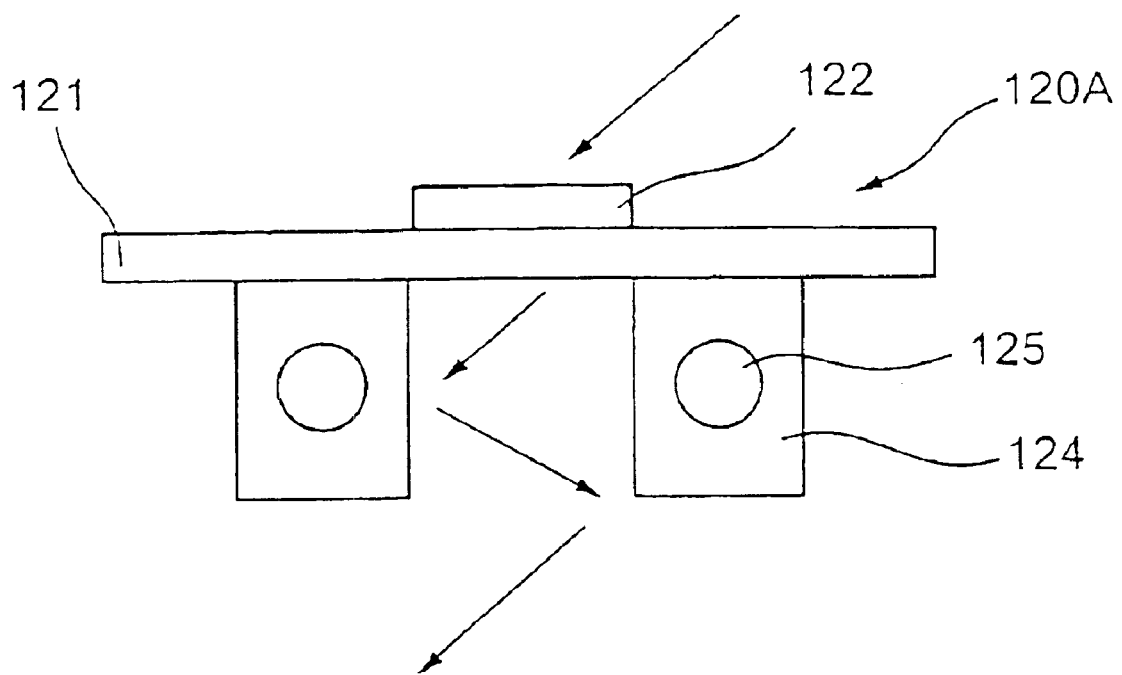
FIG. 12 is an enlarged cross-sectional view of a part of the quartz window.

A description will now be given, with reference to FIG. 12, of a quartz window 120A which is a variation of the quartz window according to the present embodiment. FIG. 12 is an enlarged cross-sectional view of a part of the quartz window 120A. The quartz window 120A has reinforcing members (or columns) 124, which are formed under the passage 128 and parallel to the passage 128. Each of the reinforcing members 124 is made of aluminum or stainless steel, and has a square cross section. The reinforcing members 124 have cooling pipes 125 therein, and increase a strength of the quartz window 120A.

The reinforcing members 124 have a good heat conductivity. Additionally, the reinforcing members 124 cannot be a source of pollution with respect to the wafer W since the reinforcing members 124 are formed of the same material as the process chamber 110. Due to the provision of the reinforcing members 124, the thickness of the quartz plate 121 can be 10 mm, preferably equal to or smaller than 7 mm, and, more preferably, about 5 mm. In the present embodiment, the dimensions of the cross section of each reinforcing member 124 is 18 mm in height and about 10 mm in width. The diameter of the cooling pipe 125 is not limited to but about 5 mm. Additionally, the cross-section of each reinforcing member 124 is no limited to a square, and an arbitrary shape such as a wave shape may be used. The present invention encompasses a quarts window 120C which is a combination of the quartz plate 121 and the reinforcing members 124 as shown in FIG. 12. As shown by arrows in FIG. 12, the radiation light from the lamps 130 is reflected by sidewalls of reinforcing members 124, and reaches the wafer W placed under the quartz window. The cooling pipe 125 has a cooling function which cools both the reinforcing members 124 and the quartz plate 121. If the reinforcing members 124 are made of aluminum, an appropriate temperature control (cooling) is needed since the aluminum may be deformed or melted at a temperature in the range of 200° C. to 700° C. The temperature control by the cooling pipe 125 may be the same as the cooling pipe 116, or other known methods may be applied.

Figure 13:
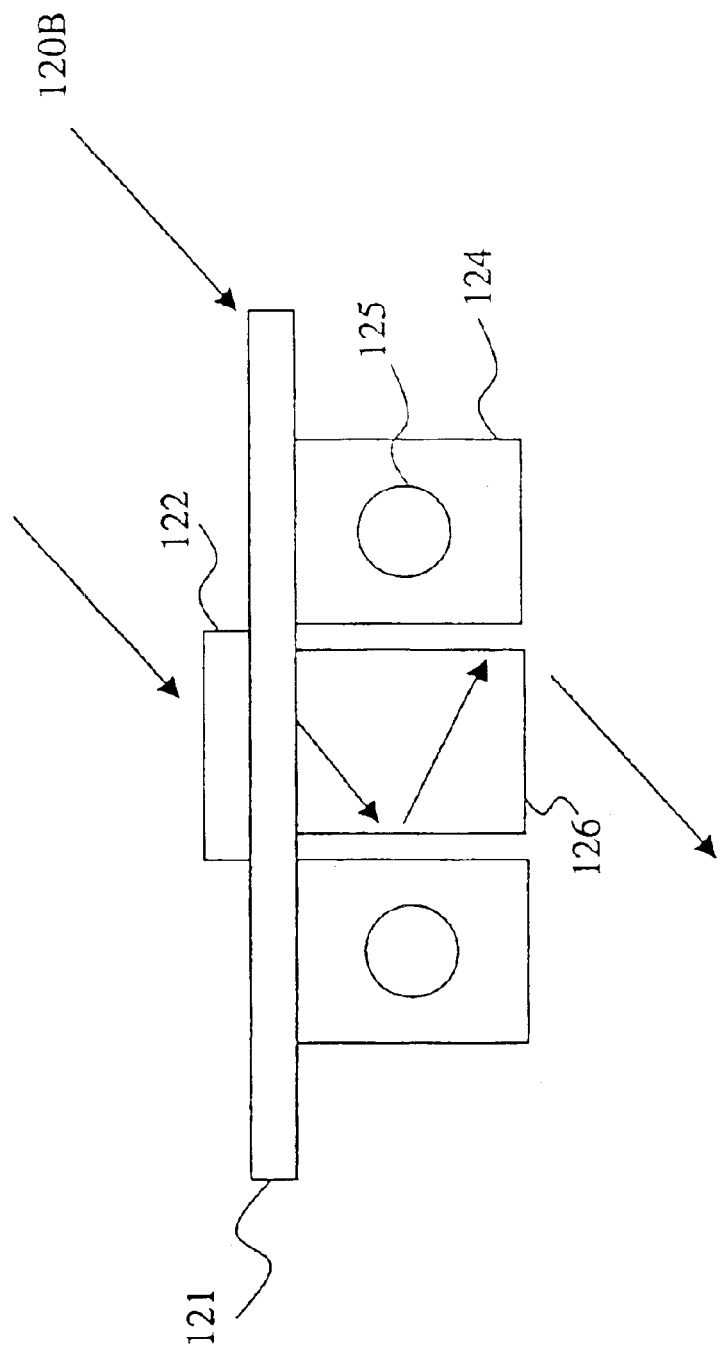
FIG. 13 is an enlarged cross-sectional view of a part of a quartz window which is a variation of the quartz window shown in FIG. 12.

A description will now be given, with reference to FIG. 13, of a quartz window 120B which is another variation of the quartz window 120 according to the present embodiment. FIG. 13 is an enlarged cross-sectional view of the quartz window 120B. The quartz window 120B has the same structure as the quartz window 120A shown in FIG. 12 except for waveguiding parts 126 having a square cross section being provided under the respective lens assemblies 122. The quartz window 120B can provide an improved irradiation efficiency than the quartz window 120A due to the waveguiding parts 126. Referring to FIG. 12, the radiation light emitted by the lamps 130 indicated by arrows generated energy loss about 10% when the radiation light is reflected by the reinforcing members 124. The rate of energy loss is dependent on the height of the reinforcing members 124 and other parameters. The energy loss can be decreased by forming a metal film having a high reflective index on the surface of the reinforcing members 124 by, for example, gold plating. However, such a metal film is not preferable since it may become a source of pollution with respect to the wafer W. Additionally, there is no material which is applicable to the reinforcing members 124 and has no reflective loss.

In order to reduce such an energy loss, the quartz window 120B is provided with the waveguiding parts 126 which has a square cross section and extending in parallel to the respective lens assemblies 122. The waveguiding parts 126 may be bonded to the quartz plate 121 by welding or may be integrally formed with each other. The waveguiding parts 126 are preferably made of quartz, and have a refractive index of about 1.4. Since the refractive index of vacuum and air is about 1.0, the radiation light is totally reflected within the quartz made waveguiding parts 126 according to the relationship between the refractive indexes of quartz and vacuum or air. Thus, the energy loss of the quartz window 120B is reduced to zero in theory.

Figure 14:
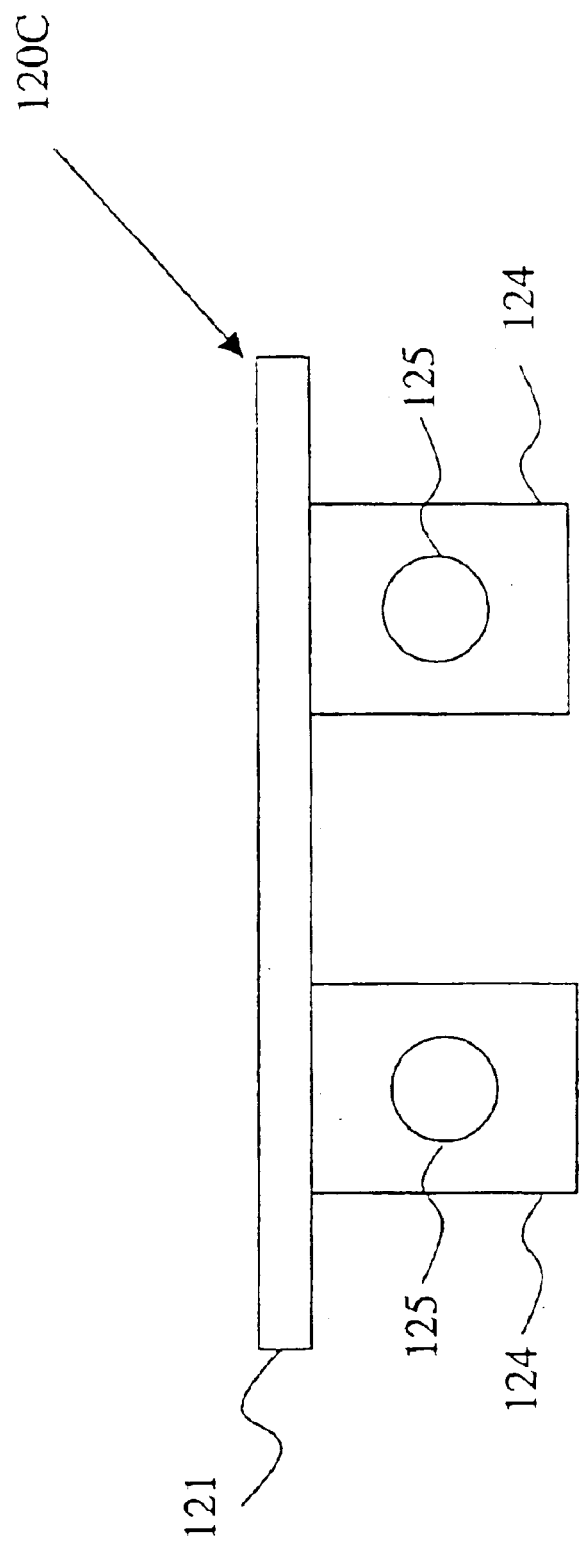
FIG. 14 is a and enlarged cross-sectional view of a part of a quartz window which is anther variation of the quartz window shown in FIG. 12.

The quartz window 120B is more preferable than a quartz window in which the reinforcing member 124 is removed and the thickness thereof is set to be equal to a sum of the thickness of the plate 121 and the thickness of the waveguiding part 126. This is because, in such a case, the same problems as the conventional thick quartz window may happen in such as case due to an increase in the thickness of the quartz window. The directivity of each of the quartz window 12B shown in FIG. 13 and the quartz window 120C shown in FIG. 14 is disclosed in Japanese Patent Application No. 2000-343209 filed by the present applicant, and the contents thereof is hereby incorporated by reference.

Figure 15:
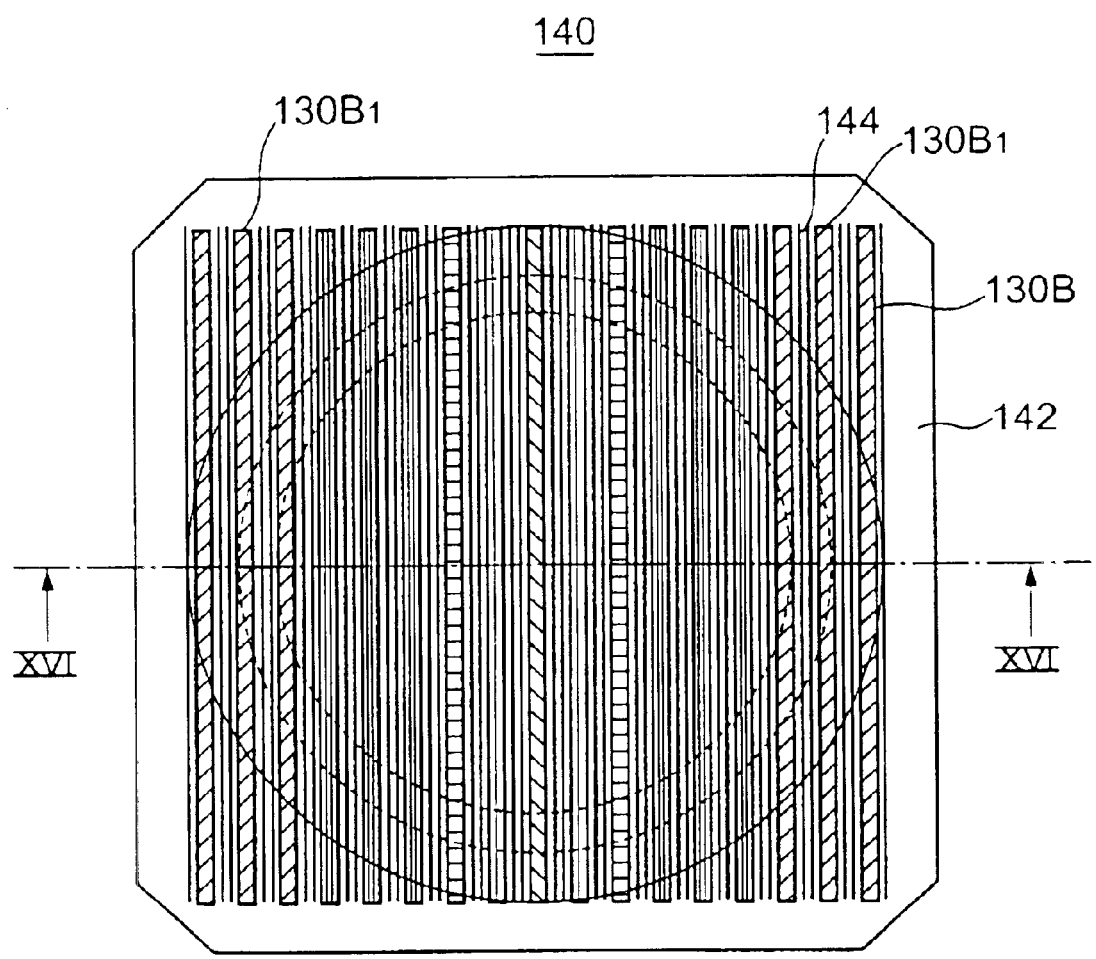
FIG. 15 is a bottom views of a heating unit of a heat treatment apparatus shown in FIG. 4.
Figure 16:
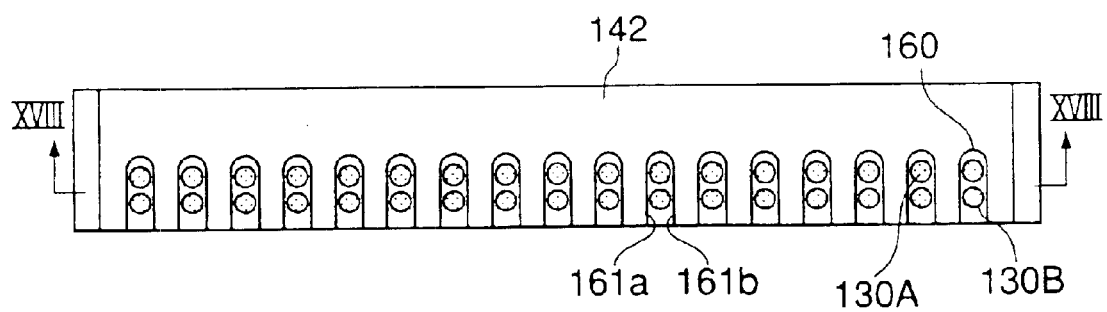
FIG. 16 is a cross-sectional view of the heating unit taken along a line XVI—XVI of FIG. 15.
Figure 17:
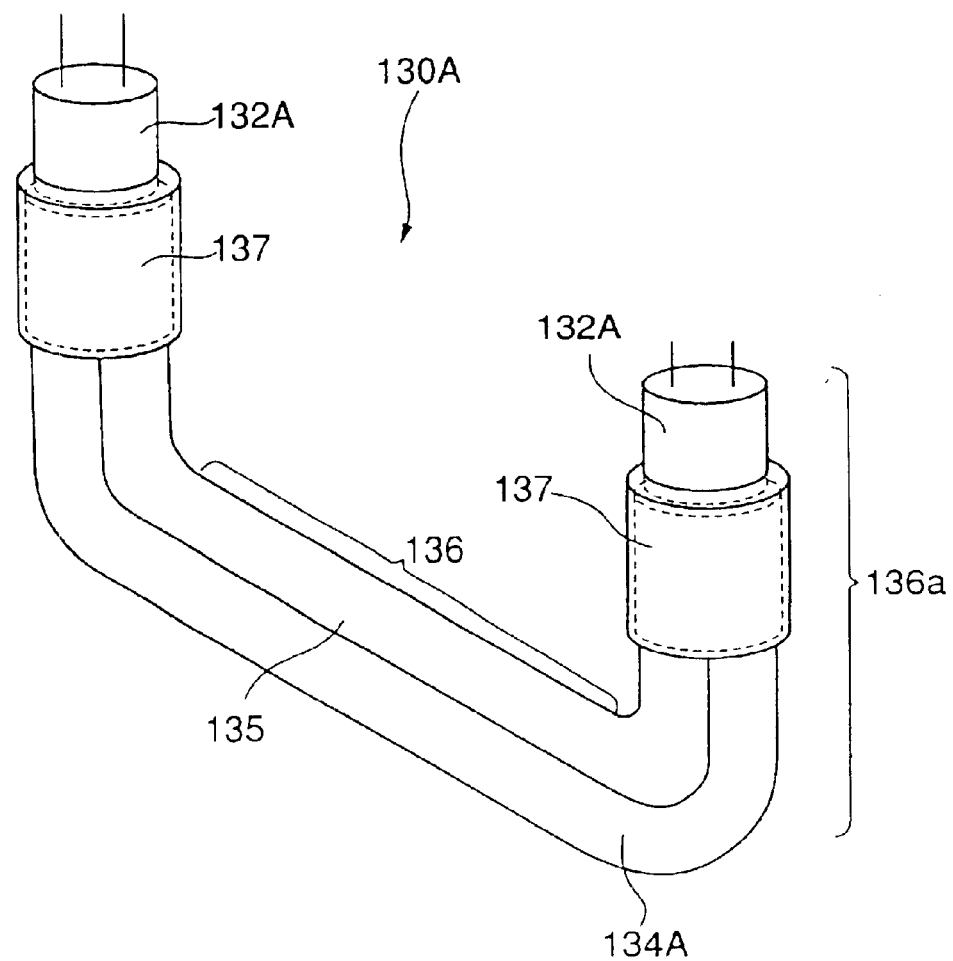
FIG. 17 is a perspective view of an upper double-end lamp shown in FIG. 5 and FIG. 16.
Figure 18:
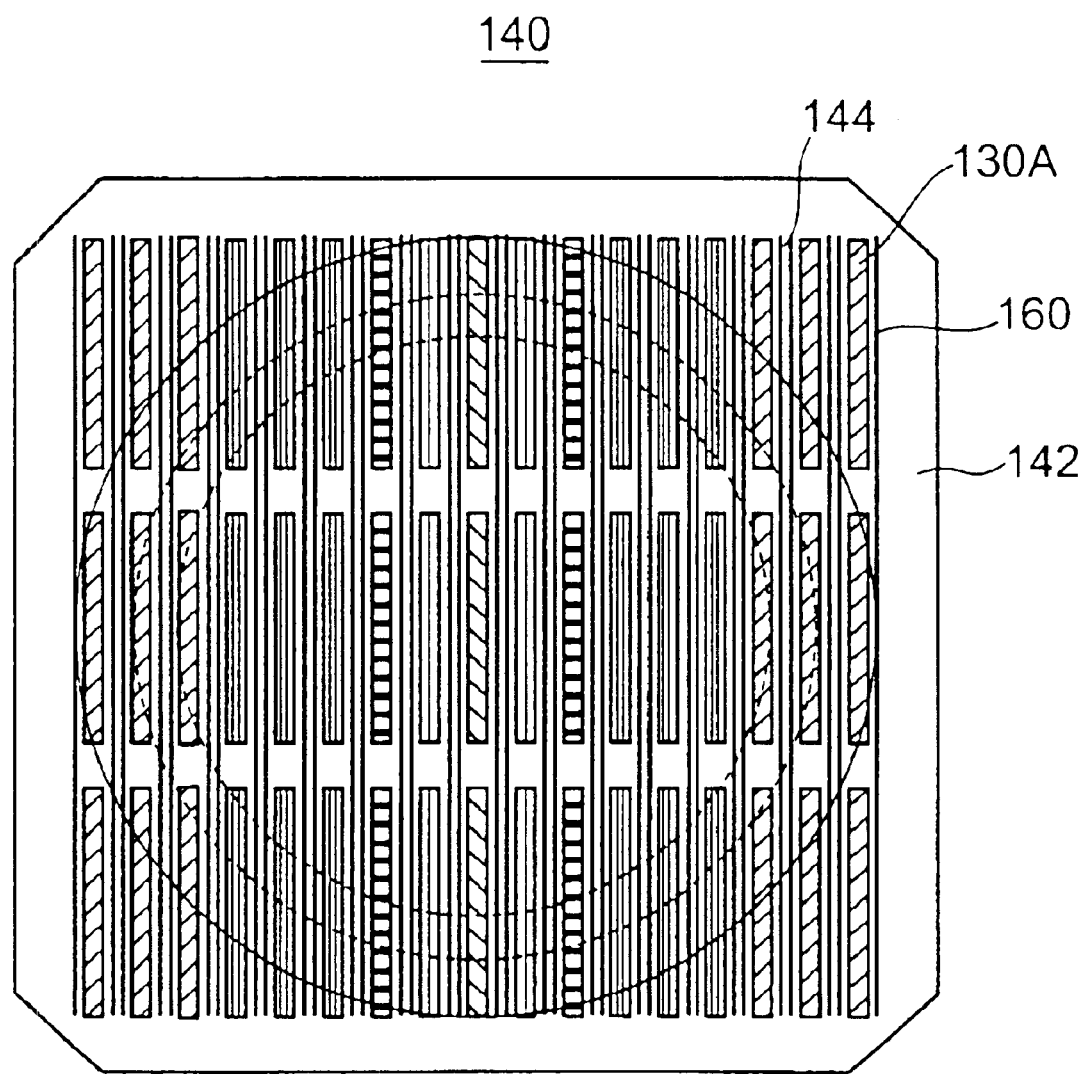
FIG. 18 is a cross-sectional view of the heating unit taken along a line XVIII—XVIII of FIG. 16.
Figure 19:
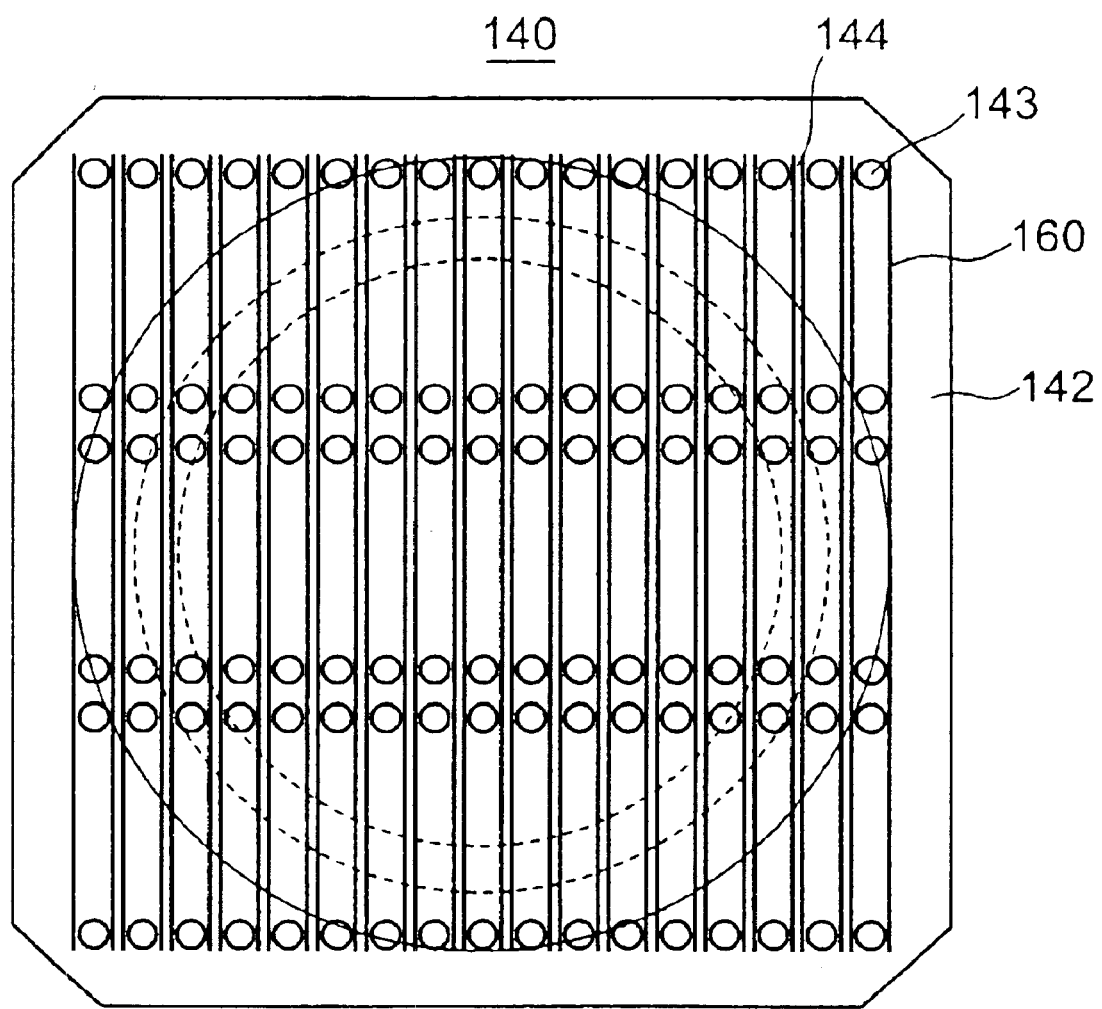
FIG. 19 is a plan view of a lamp house of the heating unit shown in FIG. 15 in a state in which the upper and lower end lamps are eliminated.

A description will now be given, with reference to FIG. 5 and FIGS. 15 through 19, of the heating unit 140 according to the present invention. FIG. 15 is a bottom view of the heating unit 140. FIG. 16 is a cross-sectional view of the heating unit 140 shown in FIG. 15 taken along a line XVI—XVI. FIG. 17 is a perspective view of an upper double-end lamp 130A shown in FIG. 16. FIG. 18 is a cross-sectional view of the heating unit 140 taken along a line XVIII—XVIII for explaining an arrangement of the upper double-end lamps 130A shown in FIG. 16. FIG. 19 is a plan view of the heating unit 140 in which the upper and lower double-end lamps 130A and 130B are removed for explaining a lamp house 142.

The heating unit 140 comprises double-end lamps 130 (the reference numeral 130 generally represents the double-end lamps 130A and 130B), reflectors 160 and a lamp house 142 accommodating these parts.

The double-end lamp 130 according to the present embodiment includes the upper double-end lamps 130A and the lower double-end lamps 130B. The relative positions of the upper and lower double-end lamps 130A and 130B are best illustrated in FIG. 5 and FIG. 16. The lamp applicable to the present invention does not always need to be in a two-stage lamp structure. For example, a lamp having the same structure as the lamp 130B may be provided underneath the lower double-end lamp 130B in parallel. The double-end lamp 130 serves a heat source for heating the object W to be processed, and the lamp 130 is not limited to but a halogen lamp in the present embodiment. The present embodiment is superior to the single-end lamp structure in the energy efficiency and economy since the double-end lamps are used. Outputs of the lamps 130 are determined by the lamp driver 130, and the lamp driver 310 is controlled by the control part 300 as described later so as to supply a corresponding power to each of the lamps 130.

As shown in FIG. 5 and FIG. 17, the lamps 130A and 130B have electrode parts 132A and 132B and light-emitting parts 134A and 134B connected to the electrode parts 132A and 132B, respectively. The light-emitting parts 134A and 134B have filaments 135A and 135B connected to the electrode parts 132A and 132B, respectively. A space between the electrode parts 132A and 132B and the light-emitting parts 134A and 134B is filled with a sealing member 137. Nitrogen, argon or halogen gas is sealed within the light-emitting parts 134A and 134B. The filaments 1354A and 135B are formed of, for example, tungsten.

The lamps 130A and 130B are different in some points. First, regarding to a shape, the lamps 13A and 130B differ from each other in a point that the lamp 130A has a U shape whereas the lamp 130B has a linear shape. Referring to FIG. 5 and FIG. 17, the lamp 130A has a pair of vertical parts 136a and a horizontal part 136b connected to the vertical parts 136a in 90 degrees, the horizontal part 136b including a straight part of the light-emitting part 134A, each of the vertical parts 136a comprises the electrode part 132A and a part of the light-emitting part 134A. A part of the lamp 130A used as a heating source for the object W to be processed is only the horizontal part 136b as illustrated in FIG. 5. On the other hand, the lamp 130B comprises a pair of electrodes 132B along a straight line and the light-emitting part 134B.

Additionally, the length of each of the vertical parts 136a of the lamp 130A is about 70 mm, and the length of the horizontal part 136b is about 130 mm. On the other hand, the length of the light-emitting part 134B of the lamp 130B is about 400 mm. As shown in FIG. 18, three lamps 130A are arranged in a direction X and seventeen lamps 130A are arranged in a direction Y. Additionally, as shown in FIG. 15, seventeen lamps 13B are arranged in the direction Y.

With respect to the outputs, as described later, the lamp 130A has a higher power than the lamp 130B. As can be interpreted from FIG. 5, the electrode parts 132A direct above the heating unit 140, and the electrode parts 132B direct sides of the heating unit 140. Each of the electrode parts 132A and 132B is supplied with a voltage of about 200 V by a power source (not shown in the figure), which voltage is generally available in a plant. Each of the electrodes 132A and 132b may be connected with a plurality of power sources so that different voltages can be supplied. The lamp driver 310 is connected to a power source (not shown in the figure) and/or the electrode parts 132A and 132B.

There are some features in the arrangement of the lamps 130. First, in the present embodiment, a plurality of lamps 130A (three lamps in the present embodiment) are aligned along a direction corresponding to a longitudinal direction (direction X) of the horizontal part 136a of the light-emitting part 132A. Although the arrangement of the lamps, in which the lamps are positioned one by one in the longitudinal direction of the light-emitting part 132B as is in the lamps 130B shown in FIG. 15, is conventionally known, each lamp 130B has only a power of about 3 kW. Accordingly, as shown in FIG. 15, the entire power of the square area is about 51 kW (in addition, it is reduced to about 40 kW which is about 77% in a circular area on the object W to be processed) even if seventeen lamps are arranged in the direction Y as shown in FIG. 15, and it is difficult to acquire a sufficient power (for example, 150 kW) for RTP (for example, a temperature rising rate is 100° C./sec). In this case, as taught by the prior art patent document, is can be considered to arrange the lamps 130B shown in FIG. 15 in multiple stages intersecting to each other. However, such a structure causes a large loss since reflectors cannot be used. Therefore, in the present embodiment, the lamps 130A have a short wavelength of about 130 mm so as to attempt a high output of the heating unit 140. The output power $W=IV=V^2/R$, and it can be appreciated that the obtained power will be increased by reducing a resistance R by reducing the wavelength since the resistance R is in proportion to the wavelength.

The horizontal part 136b of the lamp 130A has a power per unit length of 22 W/mm, and, thus, if the wavelength is about 130 mm, each lamp 130A has a power of 2,860 W. Accordingly, the heating unit 140 has a power of about 146 kW (=2,860×51/1000) with respect to 51 (=17×3) pieces in total, but the power in the circular area on the object W to be processed is about 110 kW, which is about 76% of the total power. In order to acquire an additional power necessary for RTP, four or more of the lamps 130 may be arranged in the direction X, but instead the lamps 130B are used in the present embodiment. As a result, a power of about 150 kW (40+110=150), which is necessary for RTP, is acquired on the object W to be processed.

Additionally, in the present embodiment, the reflectors 160 are attached to the lamps 130A and 130B which are arranged in parallel and multiple stages (two stages in the present embodiment). Conventionally, as disclosed in the above-mentioned patent documents, only a uniform heating of the object W to be processed has been considered with great importance and the lamps arranged in multiple stages do not have reflectors. On the other hand, in the present embodiment, the reflectors are attached so as to prevent a power loss on the assumption that a thermal discontinuity exists in the connection part between the object W to be processed and the support ring 150 due to a difference in heat capacity between the two parts even if the object W to be processed is heated uniformly so as to attempt elongation of the lamps by decreasing the voltage supplied to the lamps.

In the present embodiment, a plurality of lamps 130 are arranged linearly in the direction X in response to lens elements 123 of the lens assembly 122 so as to uniformly heat the generally circular object W to be processed as indicated by dotted line in FIG. 15 and FIG. 18. Such a linear arrangement of the lamps 130 contributes to achieve a preferred heat exhaust (for example, 4 m³/min or less).

The lump house 142 is formed of, for example, aluminum or stainless steel (SUS), and comprises a plurality of cylindrical grooves 143 and a plurality of isolation walls 144. The base part 142 has a rectangular parallelepiped shape having a generally square bottom surface (and a top surface) as shown in FIG. 18 and FIG. 19.

At least one cooling pipe (not shown in the figure) arranged parallel to the flow passage 128 (that is, in the direction X) is brought into contact with inner surfaces of the isolation walls 144. Additionally, air of about 0.3 to 0.8 m³ can be passed through the groove 143 excluding the light-emitting part 134 by a blower so that a surface of the light0emitting part 134 is cooled, and, thereby, the lamps 130 and the reflectors 160 according to the present embodiment are cooled by the air-cooling mechanism and the cooling pipe. Alternatively, the lamps 130 and the reflectors 160 can be cooled by the air-cooling mechanism alone. In such a case, the plurality of lamps 130 arranged linearly along the direction X shown in FIG. 15 is thermally exhausted (cooled) by a blower connected in series to the light-emitting parts 134 of the lamps 130. An exhaust efficiency of the blower is as good as equal to or less than 4 m³/min with respect to the linear arrangement. In a case of such a heated exhaust gas, the exhaust gas may be discharged to outside of the heat treatment apparatus 100 or may be circulated. In a case of circulation, a radiator is typically provided to the flow passage so as to cool the heated air, but the a load applied to the exhaust system is small due to the good exhaust efficiency.

As mentioned later, in a case in which the reflector 160 has a gold plated film, the air-cooling mechanism and the cooling pip maintain a temperature of each reflector 160 equal to or less than 200° C. so as to prevent the gold plate film from being separated. The temperature control by the cooling pipe may be the same as the cooling pipe 116, or any other known method known in the art may be applicable. Even if the reflector 160 has a heat resistance of more than 200° C., the temperature of the lamps 130 is preferably controlled at a temperature equal to or less than 900° C. by the cooling pipe of other cooling mechanisms since a loss of transparency (a phenomenon that the light-emitting part 134 turns white) will occur if the temperature exceeds 900° C.

Each reflector 160 has a cross section formed in the shape of a combination of a half circle and a rectangle, and extends in the longitudinal direction of the lower double-end lamp 138. The reflector 160 has a function to reflect a light emitted by the lamps 130 toward the object W to be processed via the quartz window 120. The reflector 160 is formed of a high-reflectance film such as gold or nickel, and is formed by various plating methods and other methods. If the reflector 160 is formed of a gold plate film, the film may be formed by an electroplating (hard gold plating or pure gold plating). A thickness of the reflector 160 is, for example, about 10 $\mu$m. It should be noted that the reflectors 160 are provided to merely increase the directivity of the lamps 130, and there is no limitation to the range of high-reflectance.

Preferably, the reflector 160 is processed to have an uneven surface prior to the formation of the plate film, and, thereby, the reflective film surface is also formed in an uneven surface. Thus, a rate of directing a light reflected by the reflector 160 can be increased without repeating reflection between the left and right surfaces 161*a* and 161*b* shown in FIG. 16. The unevenness can be formed by surface treatment such as sand-blasting or corrosion by a chemical solution.

Figure 20:
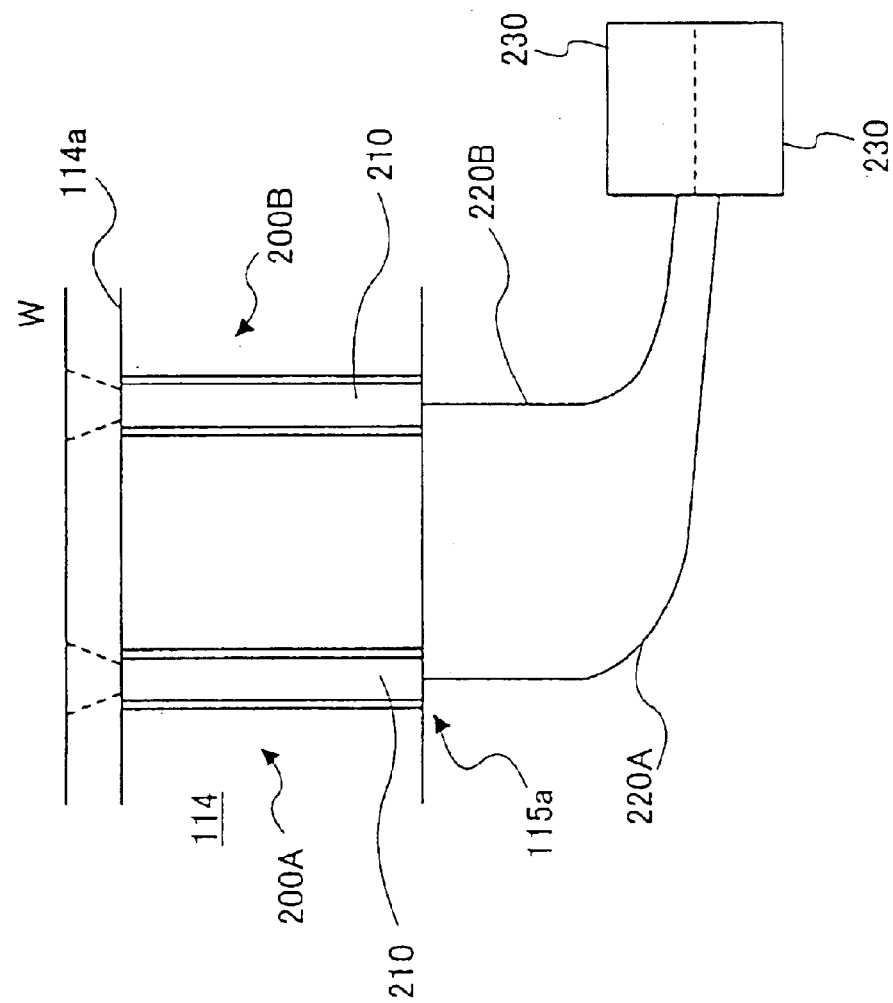
FIG. 20 is a cross-sectional view showing two kinds of radiation thermometers.
Figure 21:
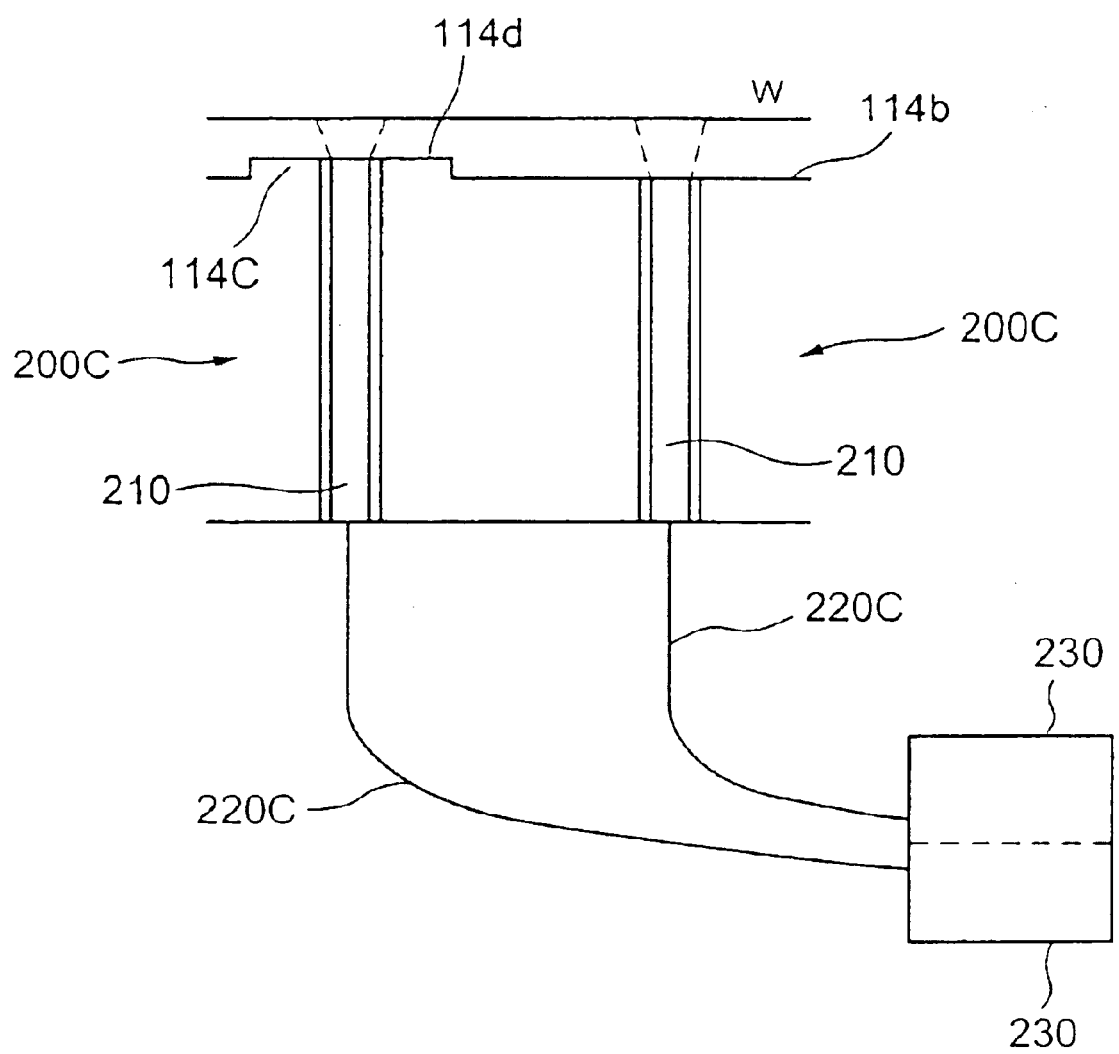
FIG. 21 is a cross-sectional view showing two radiation thermometers of the same kind.
Figure 22:
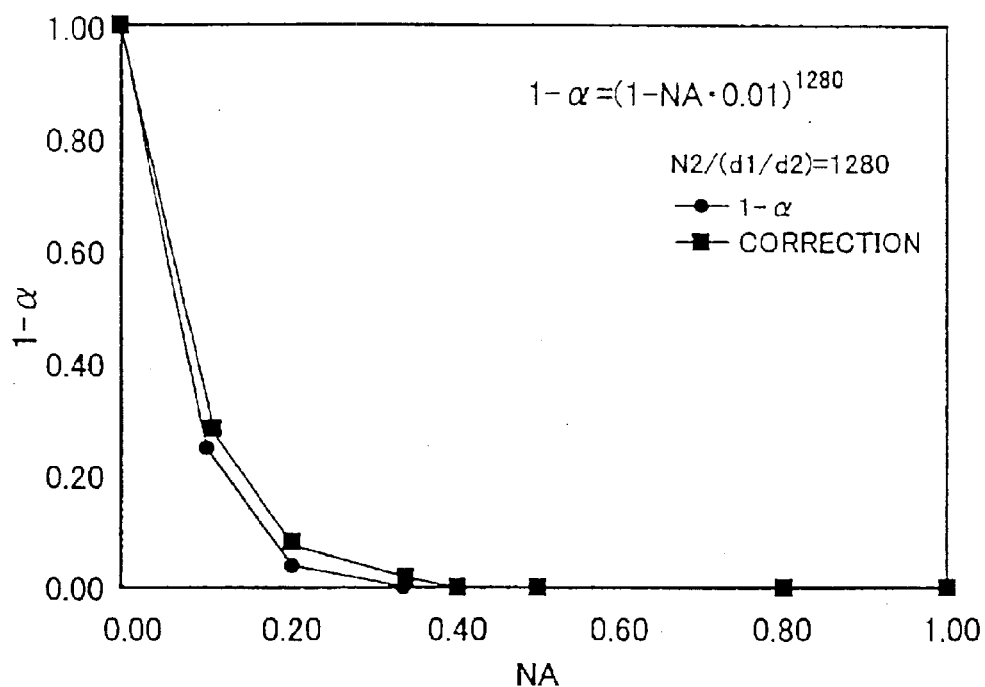
FIGS. 22, 23 and 24 are graphs for explaining the method of calculating an effective emissivity according to the present invention.
Figure 23:
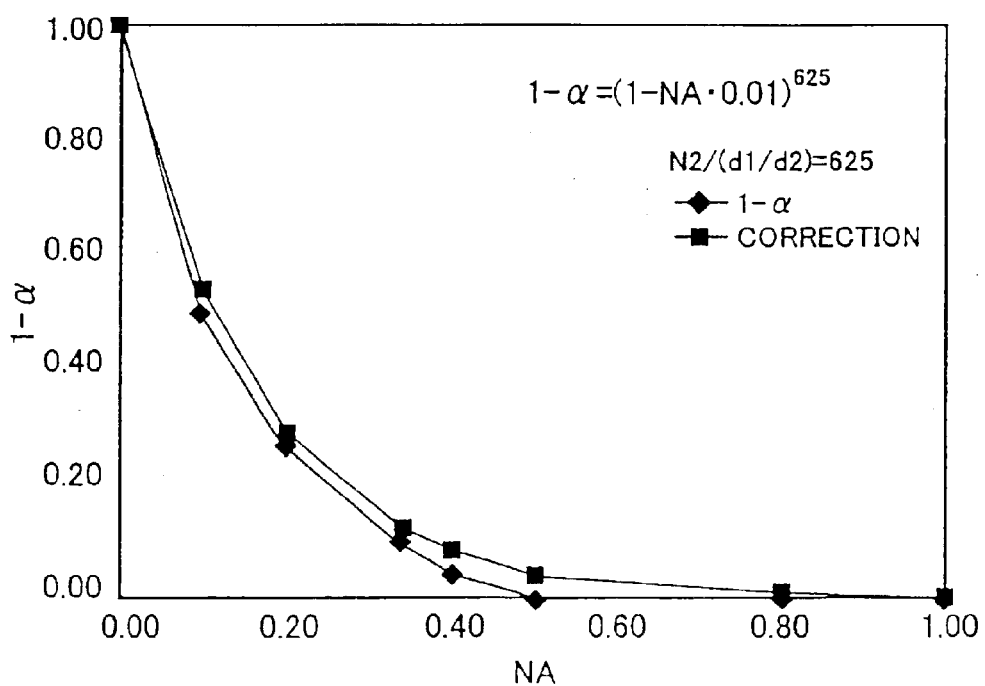
Figure 24:
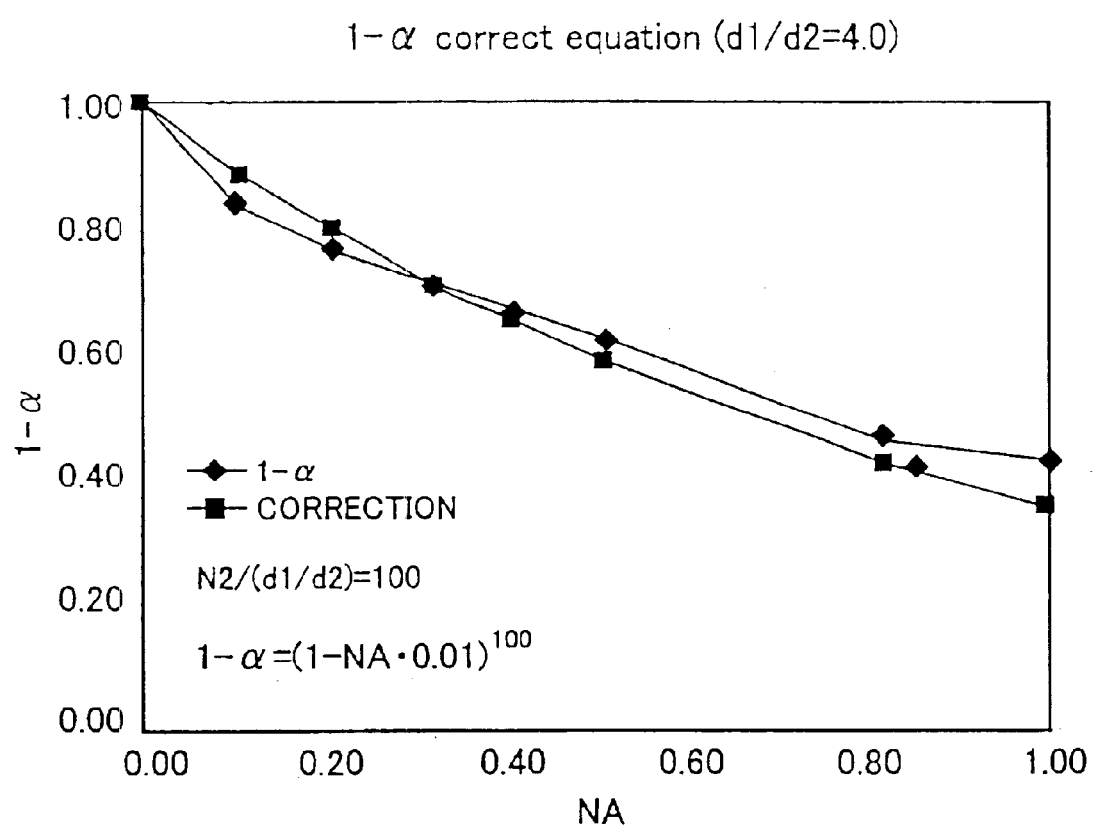

A description will now be given, with reference to FIGS. 20 through 25, of a method of calculating an effective emissivity which is another aspect of the present invention. It should be noted that the number of radiation thermometers 200 shown in FIG. 4 is merely an example. FIG. 20 is a cross-sectional view showing two kinds of radiation thermometers 200A and 200B. FIG. 21 is a cross-sectional view showing two radiation thermometers 200C of the same kind. FIGS. 22 through 24 are graphs for explaining the method of calculating an effective emissivity according to the present invention. Hereinafter, the radiation thermometers 200A, 200B and 200C may be simply referred to as radiation thermometer 200.

The radiation thermometers 200A, 200B and 200C are provided on the opposite side of the lamps 130 with respect to the wafer W. Although the present invention does not exclude the structure in which the radiation thermometers 200A, 200B and 200C is provided on the same side with the lamps 130, it is preferable that the radiation light of the lamps 130 is prevented from being incident on the radiation thermometers 200A, 200B and 200C.

Each of the radiation thermometers 200A, 200B and 200C shown in FIGS. 20 and 21 comprises a quartz or sapphire rod 210, respective optical fibers 220A, 220B and 220C, and a photodetector (PD) 230. Since the radiation thermometers 200A, 200B and 200C according to the present invention do not use a chopper, a motor for rotating the chopper, an LED and a temperature adjusting arrangement for achieving a stable light emission of the LED, the radiation thermometers 200A, 200B and 200C have a relatively inexpensive structure. It should be noted that any radiation thermometers, which are known in the art or commercially available, may be used in the present invention.

Referring to FIG. 20, the radiation thermometers 200A and 200B are mounted on a bottom part 114 of the process chamber 110. More specifically, the radiation thermometers 200A and 200B are inserted into respective cylindrical through holes 115*a* and 115*b* of the bottom part 114. A surface 114*a* of the bottom part 114 facing the interior of the process chamber 110 serves as a reflective plate (high-reflectance surface) by being subjected to a sufficient polishing. This is because if the surface 114*a* is a low reflectance surface such as a black surface, the surface 114*a* absorbs heat of the wafer W, which results in an undesired increase in the output of the lamps 130.

Each of the radiation thermometers 200A and 200B comprises the same rod 210 (210A and 210B), respective optical fibers 220A and 220B having different aperture numbers (N/A) and a photodetector (PD) 230.

The rod 210 of the present embodiment is formed of a quartz rod having a diameter off 4 mm. Although quartz and sapphire can be used since they have a food heat resistance and a good optical characteristic, the material of the rod 210 is not limited to quarts or sapphire.

If necessary, the rod 210 can protrude inside the process chamber 110 by a predetermined length. The rod 210 of each of the radiation thermometers 200A and 200B is inserted into respective through holes 115A and 115B provided in the bottom part 114 of the process chamber 110, and is sealed by an O-ring (not shown in the figure). Accordingly, a negative pressure environment can be maintained in the process chamber irrespective of the through holes 115A and 115B. The rod 210 has an excellent light collecting efficiency since the rod 210 can guide a radiation light, which is incident on the rod 210, to the respective optical fibers 210A and 210B with less attenuation and less leakage. The rod 210 receives a radiation light from the wafer W, and guides received radiation light to the PD 230 via the respective optical fibers 220A and 220B.

Each of the optical fibers 220A and 220B comprises a core which transmits a light and a concentric clad which covers the core. The core and the clad are made of a transparent dielectric material such as glass or plastic. The refractive index of the clad is slightly smaller than that of the core, thereby achieving a total reflection. Thus, the core can propagate a light without leaking outside. In order to achieve different NA, the radiation thermometers 200A and 200B use a core and clad of different materials.

The photodiode (PD) 230 has an image forming lens, a silicon (Si) photocell and an amplification circuit so as to convert the radiation light incident on the image forming lens into a voltage, which is an electric signal representing radiation intensities $E_1(T)$ and $E_2(T)$, and send the electric signal to the control part 300. The control part 300 comprises a CPU, an MPU, other processors, and memories such as a RAM and a ROM so as to calculate an emissivity $\epsilon$ and a substrate temperature T of the wafer W based on the radiation intensities $E_1(T)$ and $E_2(T)$. It should be noted that the calculation may be performed by an arithmetic part (not shown in the figure) provided in the radiation thermometers 200A, 200B and 200C. The radiation light received by the rod 210 is introduced into the photodetector (PD) 230 via the optical fibers 220A and 220B.

A description will now be given of a method of calculating an effective emissivity according to the present invention which uses different NA. Considering multiple reflection between the wafer W and the rod 210 and a direct light from the lamps 130, the effective emissivity $\epsilon_{\mathit{eff}}$ of the wafer W can be given by the following equation (2).

$$\epsilon_{\mathit{eff}} = (1-\alpha) \times \epsilon + \alpha \times \epsilon / [1 - F \times r \times (1-\epsilon)] \quad (2)$$

where, $\epsilon_{\mathit{eff}}$ represents an effective emissivity of the wafer W; $\epsilon$ represents an emissivity of the wafer W; r represents a reflectance of the surface 114a of the bottom part 114 of the process chamber 110; F is a view factor given by the following equation (3); $\alpha$ is a coefficient of multiple reflection.

$$F = (1 + \cos 2\gamma)/2 \quad (3)$$

Figure 25A:
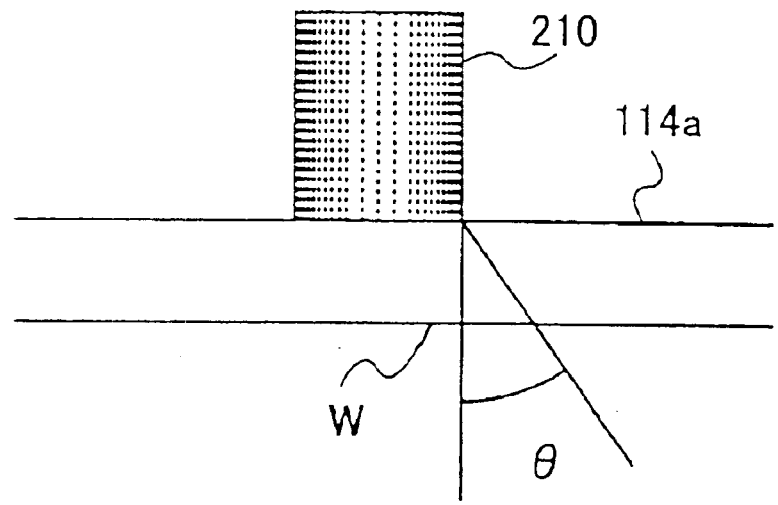
FIGS. 25A and 25B are illustrations for explaining parameters used in the calculation of an effective emissivity.
Figure 25B:
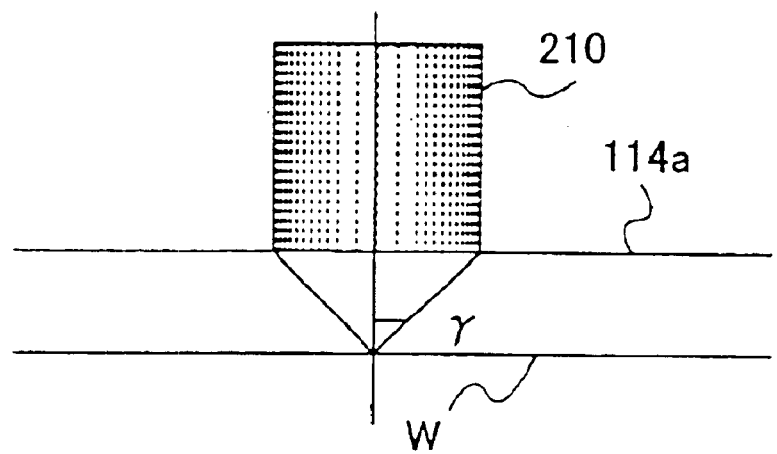

The coefficient of multiple reflection $\alpha$ is supposed to take the following values depending on three values which are 1) a diameter D1 of the rod 210, 2) a distance D2 between the wafer W and the surface 114a and 3) number of aperture NA of the radiation thermometers 200A and 200B. It should be noted that $\gamma$ represents a view angle determined by a positional relationship between the rod 210, the surface 114a and the wafer W as shown in FIG. 25B.

$$NA = 0 \rightarrow (1-\alpha) = 1 \quad (4)$$

$$NA = 1 \rightarrow (1-\alpha) \approx 1 \quad (5)$$

$$D1/D2 = \infty \rightarrow (1-\alpha) = 1 \quad (6)$$

$$D1/D2 = 0 \rightarrow (1-\alpha) = 1 \quad (7)$$

A prediction equation which can establish the above-mentioned four conditions can be defined as the following equation (8).

$$(1-\alpha) = (1 - NA \times N1)^{N2/(D1/D2)} \quad (8)$$

where N1 and N2 are the parameters in the equation (8). Accordingly, the coefficient of multiple reflection $\alpha$ is represented by the following equation (9).

$$\alpha = 1 - (1 - NA \times N1)^{N2/(D1/D2)} \quad (9)$$

It can be appreciated that the coefficient of multiple reflection $\alpha$ represented by the equation (9) possibly satisfies the equations (4) through (7). Thus, the adequacy of equation (9) is considered by determining N1 and N2 based on equation (9).

First, a calculation is made by fixing the diameter (4 mm) of the rod 210 and varying NA. It is assumed that the wafer W has $\epsilon = 0.2$ for, the sake of saving time. At this time, NA ranges from 0 to 1. Values of N1 and N2/(D1/D2) are tentatively determined by comparing data obtained by the calculation and the assumption of equation (9). In a similar manner, values of N1 and N2/(D1/D2) are determined for the diameters of 2 mm and 20 mm. As for a method of determining N1 and N2, N2 and N2/(D1/D2)–D1/D2 curve are used. N1 is selected so that N2 is common to the three conditions in N2/(D1/D2).

According to the tentative values of N1 and N2/(D1/D2) determined by the above-mentioned method, relationships between $(1-\alpha)$ and NA are shown in FIGS. 44 through 46. As a result, N1=0.01 and N2=500 are obtained, and equation (9) can be represented by the following equation (10).

$$\alpha = 1 - (1 - 0.01 \times NA)^{500/(D1/D2)} \quad (10)$$

Accordingly, if the diameter of the rod 210 is changed, or if the distance between the wafer W and the surface 114a is changed, the effective emissivity can be easily calculated irrespective of the value of NA.

In a case in which the optical fiber 220A has NA=0.2 and the optical fiber 220B has NA=0.34, the coefficients of multiple reflection $\alpha_{0.2}$ and $\alpha_{0.34}$ can be represented by the following equations (11) and (12).

$$\alpha_{0.2} = 1 - (1 - 0.01 \times 0.2)^{500/(D1/D2)} \quad (11)$$

$$\alpha_{0.34} = 1 - (1 - 0.01 \times 0.34)^{500/(D1/D2)} \quad (12)$$

Accordingly, the effective emissivity of the wafer W can be given by the following equations (13) and (14).

$$\epsilon\mathit{eff}_{0.2} = (1-\alpha_{0.2}) \times \epsilon + \alpha_{0.2} \times \epsilon / [1 - F \times r \times (1-\epsilon)] \quad (13)$$

$$\epsilon\mathit{eff}_{0.34} = (1-\alpha_{0.34}) \times \epsilon + \alpha_{0.34} \times \epsilon / [1 - F \times r \times (1-\epsilon)] \quad (14)$$

The radiation thermometer 200 performs the conversion of temperature based on radiation light flux (W). Thus, a difference in the incident light fluxes at the two radiation thermometers are given by the following equations (15) and (16), where $\theta 1$ is an incident angle at NA=0.2 and $\theta 2$ is an incident angle at NA=0.34. The incident angle $\theta$ represents a maximum light-receiving angle of an optical fiber as shown in FIG. 36A, and the incident angle $\theta$ can be represented as $\theta = \sin^{-1}(NA)$.

$$E_{0.2} = A_{ROD} \times (r \times \tan \theta 1)^2 \times \pi \times L/r^2 \quad (15)$$

$$E_{0.34} = A_{ROD} \times (r \times \tan \theta 2)^2 \times \pi \times L/r^2 \quad (16)$$

Accordingly, the ratio of the incident light fluxes of the two radiation thermometers 200A and 200B can be represented by the following equation (17)

$$\epsilon\mathit{eff}_{0.34} \times E_{0.34})/(\epsilon\mathit{eff}_{0.2} \times E_{0.2}) = (\epsilon\mathit{eff}_{0.34} \times \tan^2\theta 2)/(\epsilon\mathit{eff}_{0.2} \times \tan^2\theta 1) \quad (17)$$

According to the above-mentioned equations (13) and (14), equation (17) can be changed into the following equation (18).

$$(\epsilon\mathit{eff}_{0.34} \times E_{0.34})/(\epsilon\mathit{eff}_{0.2} \times E_{0.2}) = \{(1-\alpha_{0.34}) \times \epsilon + \alpha_{0.34} \times \epsilon/[1 - F \times r \times (1-\epsilon)]\} \times \tan^2\theta 2 / \{(1-\alpha_{0.2}) \times \epsilon + \alpha_{0.2} \times \epsilon/[1 - F \times r \times (1-\epsilon)]\} \quad (18)$$

Then, if $\beta$ is defined as in the following equation (19), the above-mentioned equation (18) can be changed into the following equations (20) through (24).

$$\beta = [(\epsilon\mathit{eff}_{0.34} \times E_{0.34})/(\epsilon\mathit{eff}_{0.2} \times E_{0.2})] \times \quad (19)$$

$$[(\epsilon\mathit{eff}_{0.34} \times \tan^2\theta 2)/(\epsilon\mathit{eff}_{0.2} \times \tan^2\theta 1)]$$

$$\beta \times \{(1-\alpha_{0.2}) \times \epsilon + \alpha_{0.2} \times \epsilon/[1 - F \times r \times (1-\epsilon)]\} = \quad (20)$$

$$\{(1-\alpha_{0.34}) \times \epsilon + \alpha_{0.34} \times \epsilon/[1 - F \times r \times (1-\epsilon)]\}$$

-continued $$\beta \times \{(1-\alpha_{0.2}) \times [1 - F \times r \times (1-\varepsilon)] + \alpha_{0.2}\} = \qquad (21)$$
$$\{(1-\alpha_{0.34}) \times [1 - F \times r \times (1-\varepsilon)] + \alpha_{0.34}\}$$

$$\beta \times (1-\alpha_{0.2}) - \beta \times (1-\alpha_{0.2}) \times [F \times r \times (1-\varepsilon)] + \beta \times \alpha_{0.2} = \qquad (22)$$
$$(1-\alpha_{0.34}) - (1-\alpha_{0.34}) \times [F \times r \times (1-\varepsilon)] + \alpha_{0.34}$$

$$\beta \times (1-\alpha_{0.2}) - \beta \times (1-\alpha_{0.2}) \times F \times r + \beta \times (1-\alpha_{0.2}) \times F \times r \times \varepsilon - \qquad (23)$$
$$(1-\alpha_{0.34}) = -(1-\alpha_{0.34}) \times F \times r + F \times r \times (1-\alpha_{0.34}) \times \varepsilon + \alpha_{0.34}$$

$$\beta \times (1-\alpha_{0.2}) - \beta \times (1-\alpha_{0.2}) \times F \times r + \beta \times \alpha_{0.2} - (1-\alpha_{0.34}) + (1-\alpha_{0.34}) \times F \times r - \alpha_{0.34} = (1-\alpha_{0.34}) \times F \times r \times \varepsilon - \beta \times (1-\alpha_{0.2}) \times F \times r \times \varepsilon \qquad (24)$$

Accordingly, the emissivity $\varepsilon$ of the wafer W can be calculated by the following equation (25).

$$\varepsilon = \{\beta \times (1-\alpha_{0.2}) - \beta \times (1-\alpha_{0.2}) \times F \times r + \beta \times \alpha_{0.2} - \qquad (25)$$
$$(1-\alpha_{0.34}) + (1-\alpha_{0.34}) \times F \times r - \alpha_{0.34}\} /$$
$$\{(1-\alpha_{0.34}) \times F \times r - \beta \times (1-\alpha_{0.2}) \times F \times r\}$$

Then, the effective emissivity is calculated again by the equations (11) and (12). At this time, the calculation is performed based on the small value of NA, that is, NA=2. The following equation (26) can be obtained by entering the emissivity $\varepsilon$, which was calculated by equation (23), in equation (11).

$$\varepsilon eff_{0.2} = (1-\alpha_{0.2}) \times \varepsilon + \alpha_{0.2} \times \varepsilon / [1 - F \times r \times (1-\varepsilon)] \qquad (26)$$

Since radiation energy of $E_{0.2}$ is incident on the radiation thermometer 200A of NA=0.2, the following equation (27) is established, where $E_b$ is radiation energy according to black body radiation.

$$E_{0.2} = \varepsilon eff_{0.2} \times E_b \qquad (27)$$

Then, the above-mentioned equation (25) is changed as follows.

$$E_b = E_{0.2} / \varepsilon eff_{0.2} \qquad (28)$$

Regarding incident energy, the following relationship is defined by Japanese Industrial Standard (JIS 1612), where T represents a temperature of the wafer W; c2 represents a second constant of radiation (0.014388 m/k); A, B and C are constants peculiar to the radiation thermometer 200 (determined by calibration); Eb is radiation energy from a black body (normally an output V of a radiation thermometer).

$$T = c2/A/(lnC - lnE_b) - B/A \qquad (29)$$

The above-mentioned calculation method obtains an emissivity of the wafer W by the two radiation thermometers 200A and 200B having different NAs, the emissivity can be obtained based on the above-mentioned equation (9) by changing a ratio of D1/D2. FIG. 21 is an illustration for explaining such a method.

In FIG. 21, a bottom surface 114b corresponding to the bottom surface 114a and an upper surface 114d of a protruding part 114c protruding form the bottom surface 114b are provided in the bottom part 114 of the process chamber 110. Accordingly, identical radiation thermometers 200C are used, but distances between the wafer W and the quartz rod 210 of each of the radiation thermometers 200C are different. Thus, in the example shown in FIG. 21, an emissivity of the wafer W can be obtained similar to the example shown in FIG. 20.

For example, in FIG. 21, the two radiation thermometers 200C have NA=0.2, and the distance between the wafer W and the rod 210 of one of the radiation thermometers 200C is set to 3.5 mm (left side of FIG. 21) and the distance between the wafer W and the rod 210 of the other radiation thermometer 200C is set to 5 mm (right side of FIG. 21). Additionally, the diameter of the rod 210 is set to 4 mm: According to equation (9), each coefficient of multiple reflection can be represented by the following equations (30) and (31).

$$\alpha_{3.5} = 1 - (1 - 0.001 \times 0.2)^{500/(D1/3.5)} \qquad (30)$$

$$\alpha_{5.0} = 1 - (1 - 0.001 \times 0.2)^{500/(D1/5.0)} \qquad (31)$$

Using the above equations (30) and (31), the effective emissivities $\alpha_{3.5}$ and $\alpha_{5.0}$ are obtained in the similar manner as equations (13) and (14). The subsequent calculation of obtaining the temperature of the wafer W is performed in the same manner as that explained with reference to equations (15) through (28) by replacing the suffix 0.2 by 3.5 and 0.34 by 5.0.

The detector 270 and the control part 300 can calculate the temperature T of the wafer W based on equations (25) through (29). In any case, the control part 300 can obtain the temperature T of the wafer W. Additionally, a temperature measurement calculation program including the above-mentioned equations is stored in a computer readable medium such as a floppy disk, or the program is distributed through a communication network such as the Internet or the like.

Additionally, as shown in FIG. 4, the radiation thermometers 200 are provided not only under the center of the object to be processed but also a plurality of positions adjacent to the connection part W1. This is for the reason, as mentioned later, that the control part 300 determines whether or not the temperature distribution of the object to be processed is uniform.

The control part 300 has a CPU and a memory incorporated therein. The control part 300 feedback-controls the output of the lamps 130 by recognizing the temperature T of the wafer W and controlling the lamp driver 310. Additionally, the control part 300 controls a rotational speed of the wafer W by sending a drive signal to the motor driver 320 at a predetermined timing. A description will be given below of a heat treatment control method for an object W performed by the control part 300 according to the present invention.

The support ring 150 has a circular ring-like shape and formed of ceramics such as SiC having an excellent heat resistance. The support ring 150 serves as a placement stage of the object W to be processed, and has an L-shaped cross section. The inner hollow part of the support ring 150 has a diameter smaller than the diameter of the object W to be processed, and, thus, the support ring 150 can support a periphery of a back surface of the object W to be processed. If necessary, the support ring 150 may be provided with an electrostatic chuck or a clamp mechanism for fixing the object W to be processed.

Figure 26:
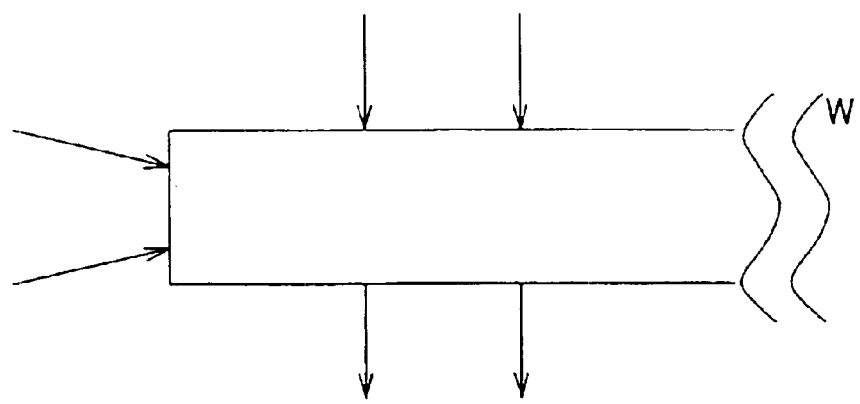
FIG. 26 is an illustration for explaining a light incident on the object to be processed when a support ring does not exist.
Figure 27:
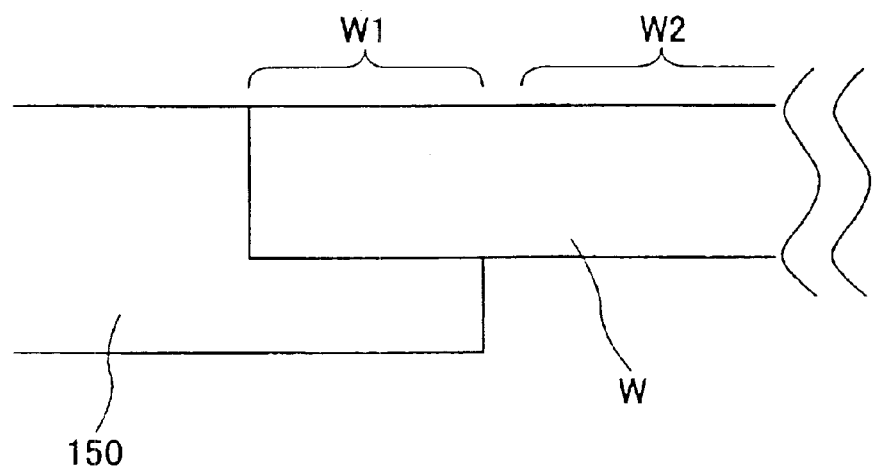
FIG. 27 is an illustrative cross-sectional view of a contacting part between the object to be processed and the support ring.

The support ring 150 has an original object to maintain a uniform temperature distribution of the object W to be processed. That is, if the support ring 150 does not exist, a radiation light enters (or exits) the edge of the object W to be processed from many directions as shown in FIG. 26, and, thus, the temperature of the edge of the object W to be processed rapidly rises (or rapidly falls), which results in a non-uniform temperature distribution at the edge of the object W to be processed. FIG. 26 is an illustration for explaining a light incident on the object W to be processed when the support ring 150 does not exist. The support ring 150 prevents the radiation light from entering the edge of the object W to be processed so as to maintain a uniform temperature distribution of the object W to be processed. However, for example, if the object W to be processed is a semiconductor silicon single crystal substrate, the heat capacity of the object W to be processed is different from that of the support ring 15 which is formed of SiC, and, thus, the temperature rising rates of both parts are different from each other eve if the same power is applied. FIG. 27 is an illustrative cross-sectional view of the connection part W1 between the object W to be processed and the support ring 150. If the heating unit 140 achieves a uniform heating, the connection part W1 is a thermally discontinuous part. More specifically, even if a uniform heating is applied to the object W to be processed, a temperature of the connection part W1 is lower than a temperature of the center of the object W to be processed.

Figure 28:
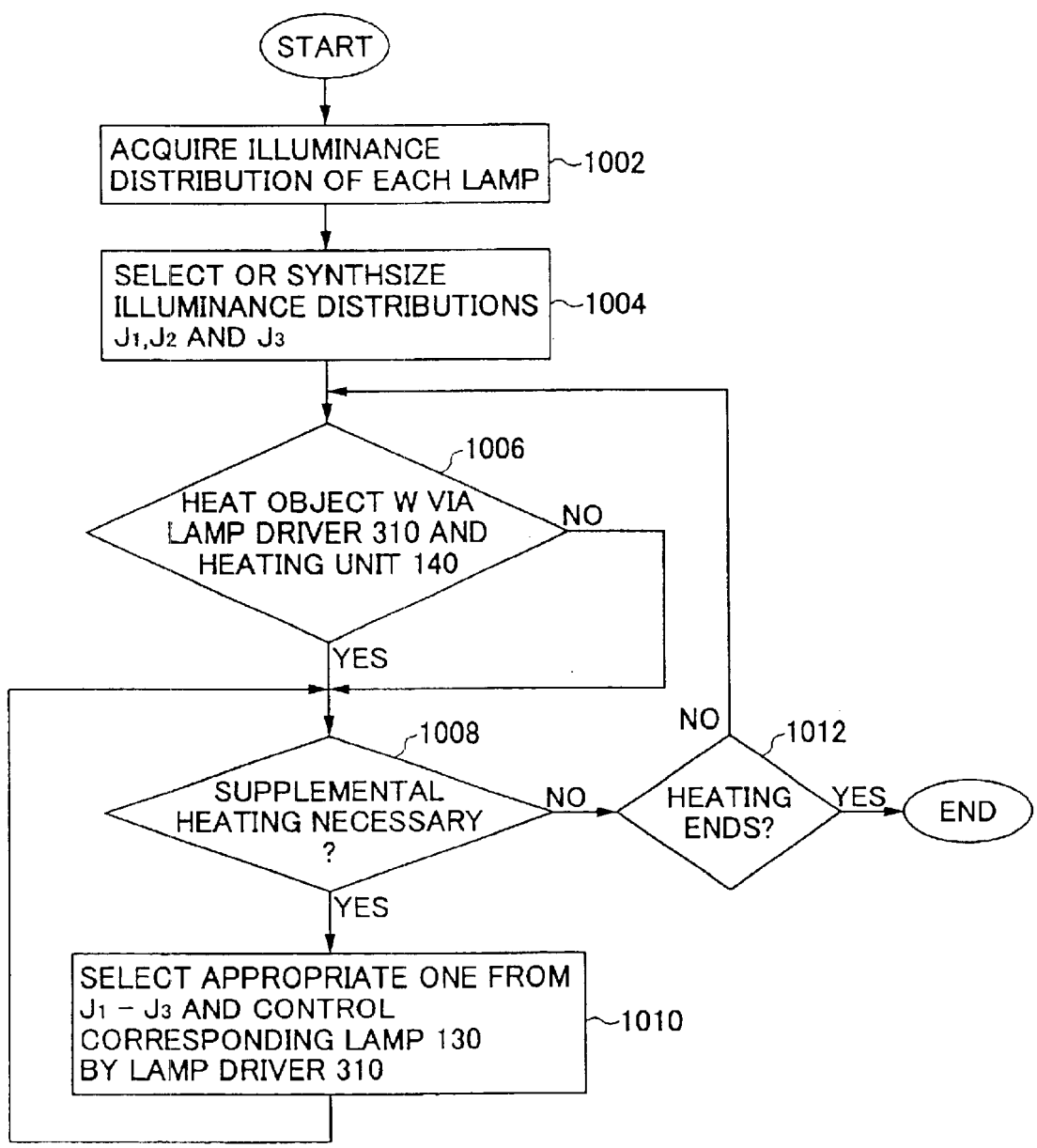
FIG. 28 is a flowchart for explaining a heat treatment controlling method according to one aspect of the present invention.

In view of the above point, the control part 300 according to the present embodiment controls the lamp driver 310 to heat only the connection part W1. However, practically, it is difficult to heat only the connection part W1. For example, if only the lamps $130B_1$ and $130B_2$ are turned on and the remaining lamps are turned off, it cannot heat only the connection portion W1 and, additionally, the center W2 is also heated. A description will be given below, with reference to FIGS. 28 through 33, of a heat treatment controlling method according to the present invention. FIG. 28 is a flowchart for explaining the heat treatment controlling method according to one aspect of the present invention. FIGS. 29 through 33 are graphs showing illuminance distribution used for eth heat treatment controlling method shown in FIG. 28.

Figure 29:
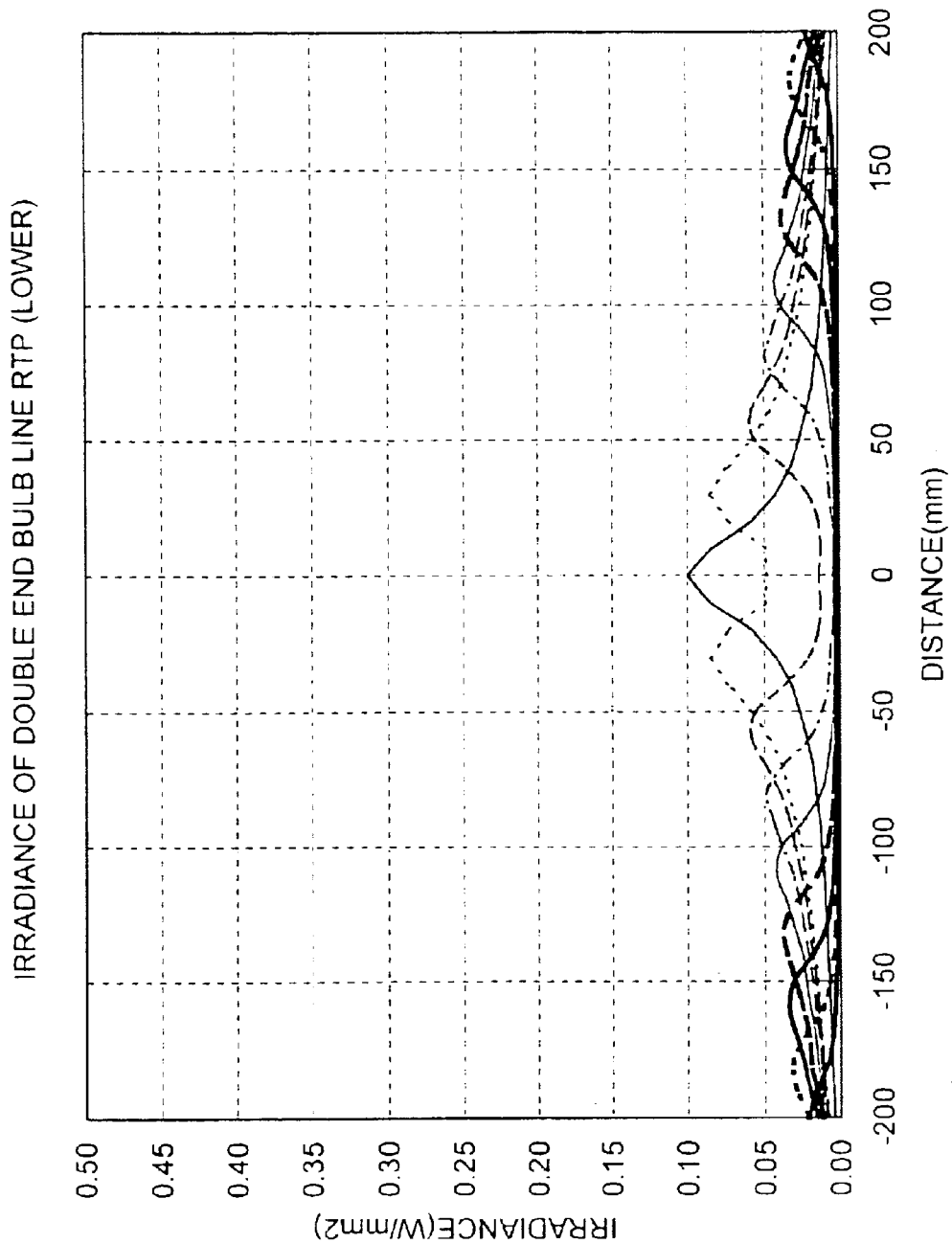

First, the control part 300 acquire an individual illuminance distribution of each lamp 130 (step 1002). FIG. 29 is an illuminance distribution of each of the lower double-end lamps 130B. FIG. 29 shows a relationship between a distance (horizontal axis) and illuminance (vertical axis) when about 200 V is applied to one of the lamps 130B having a power of 3 kW. An original point of the horizontal axis corresponds to the center of the object W to be processed. Numbers 1 through 9 are assigned to the lamps 130B so that number 1 is assigned to the lamp 130B at the center in FIG. 15, number 2 is assigned to the lamps 130B on both sides and number 3 is assigned to the lamps 130B on outer side of the number 2 lamp, and so on. A distance between the lamps 130B and the object W to be processed is about 47 mm, and the object W to be processed and the support ring 150 are rotated by a rotating mechanism described later. The same hatching in FIG. 15 indicates that the same number is assigned.

Figure 30:
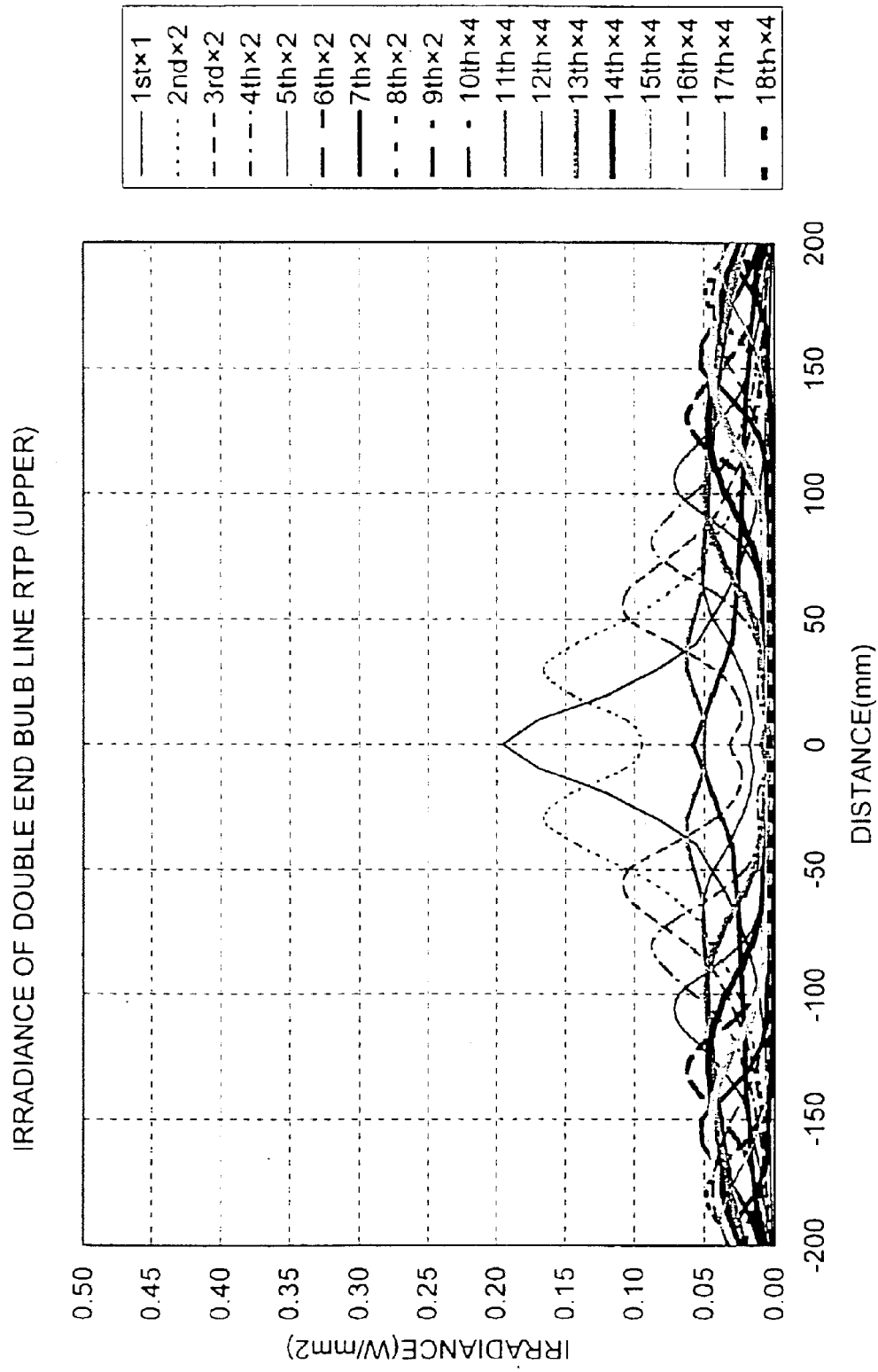

FIG. 30 is an illuminance distribution of each of the upper double-end lamps 130A. FIG. 30 shows a relationship between a distance (horizontal axis) and illuminance (vertical axis) when about 200 V is applied to one of the lamps 130A having a power of 3 kW. An original point of the horizontal axis corresponds to the center of the object W to be processed. Numbers 1 through 18 are assigned to the lamps 130A so that number 1 is assigned to the lamp 130A at the center in FIG. 18, number 2 is assigned to the lamps 130A on both sides and number 3 is assigned to the lamps 130A on outer side of the number 2 lamps, and so on. A distance between the lamps 130A and the object W to be processed is about 60 mm, and the object W to be processed and the support ring 150 are rotated by a rotating mechanism described later. The same hatching in FIG. 18 indicates that the same number is assigned.

Then, the control part 300 produce an illuminance distribution to be achieved by electing or synthesizing the illumination distributions $J_1$, $J_2$ and $J_3$ (step 1004) wherein the illuminance distribution $J_1$ has a maximum at the center W2 of the object W to be processed, the illuminance distribution $J_2$ has a maximum at the connection part W1 between the object W to be processed and the support ring 150, and the illuminance distribution $J_3$ has a maximum at the center of the support ring 150 and the illuminance at the center of the object W to be processed is 0.17 W/mm$^2$. Since the heat treatment apparatus according to the present invention require a rapid temperature rise of the object W to be processed for RTP, the maximum of the illuminance distributions $J_1$ and $J_2$ is preferably as high as possible. Accordingly, the control part 300 normally produces a desired illuminance distribution by arbitrarily synthesizing the illuminance distributions $J_1$, $J_2$ and $J_3$. It should be noted that the illuminance distribution J3 is mainly used for heating the connection part W1, and the illuminance at the center of the object W to be processed is set below 0.17 W/mm$^2$ so that the center W2 of the object W to be processed is not heated at the same time of heating. The value of 0.17 W/mm$^2$ is an experimentally determined value, which is sufficiently small that the center W2 of the object W to be processed is not heated.

Figure 31:
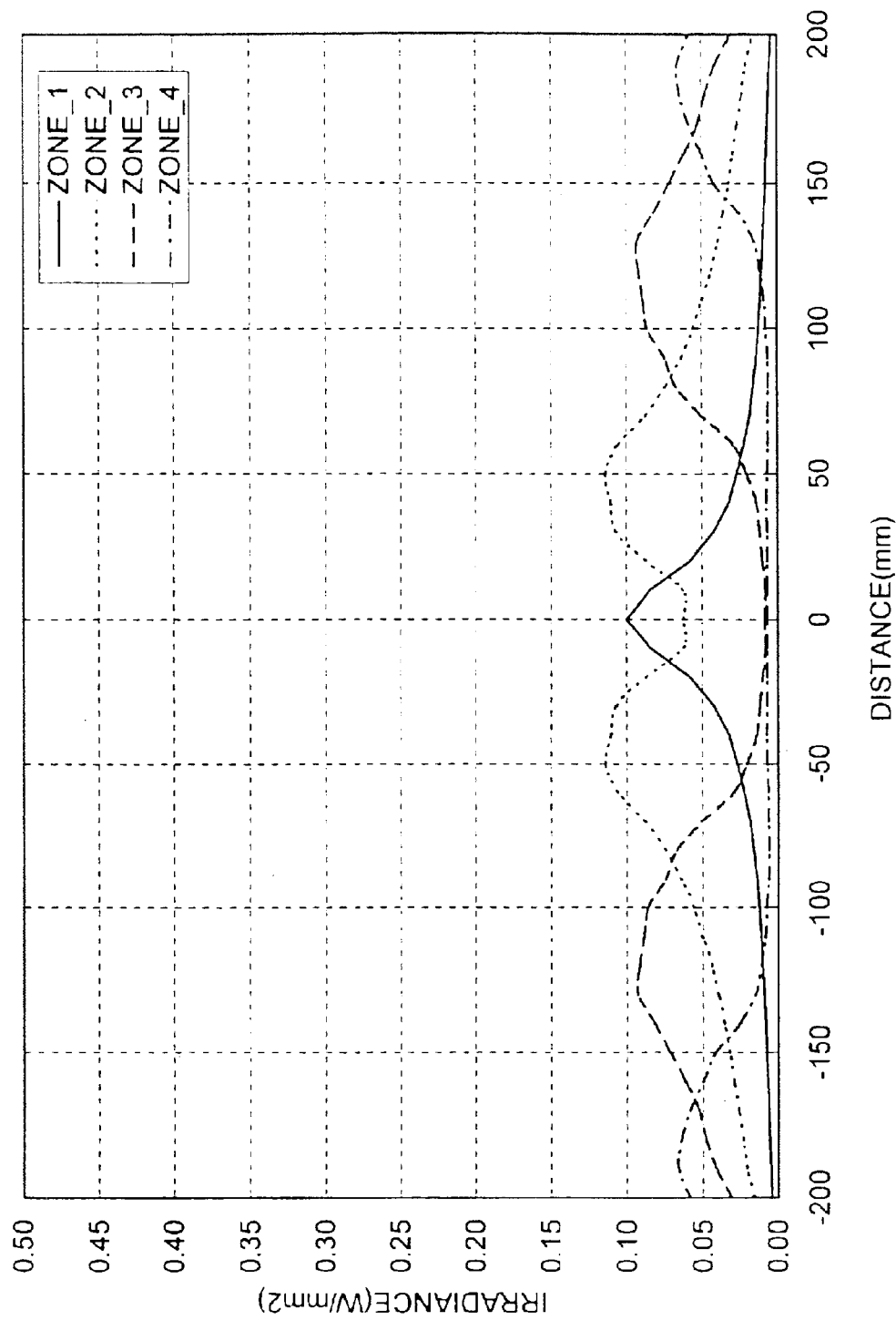

FIG. 31 is a graph showing an illumination distribution produced by synthesizing illuminance distributions of the lamps 130B corresponding to a plurality of zones (four zones in the present embodiment). In other words, the graph of FIG. 31 is produced by dividing the illuminance distribution of the 17 lamps 130B shown in FIG. 29 into four zones and synthesizing for each zone.

Figure 32:
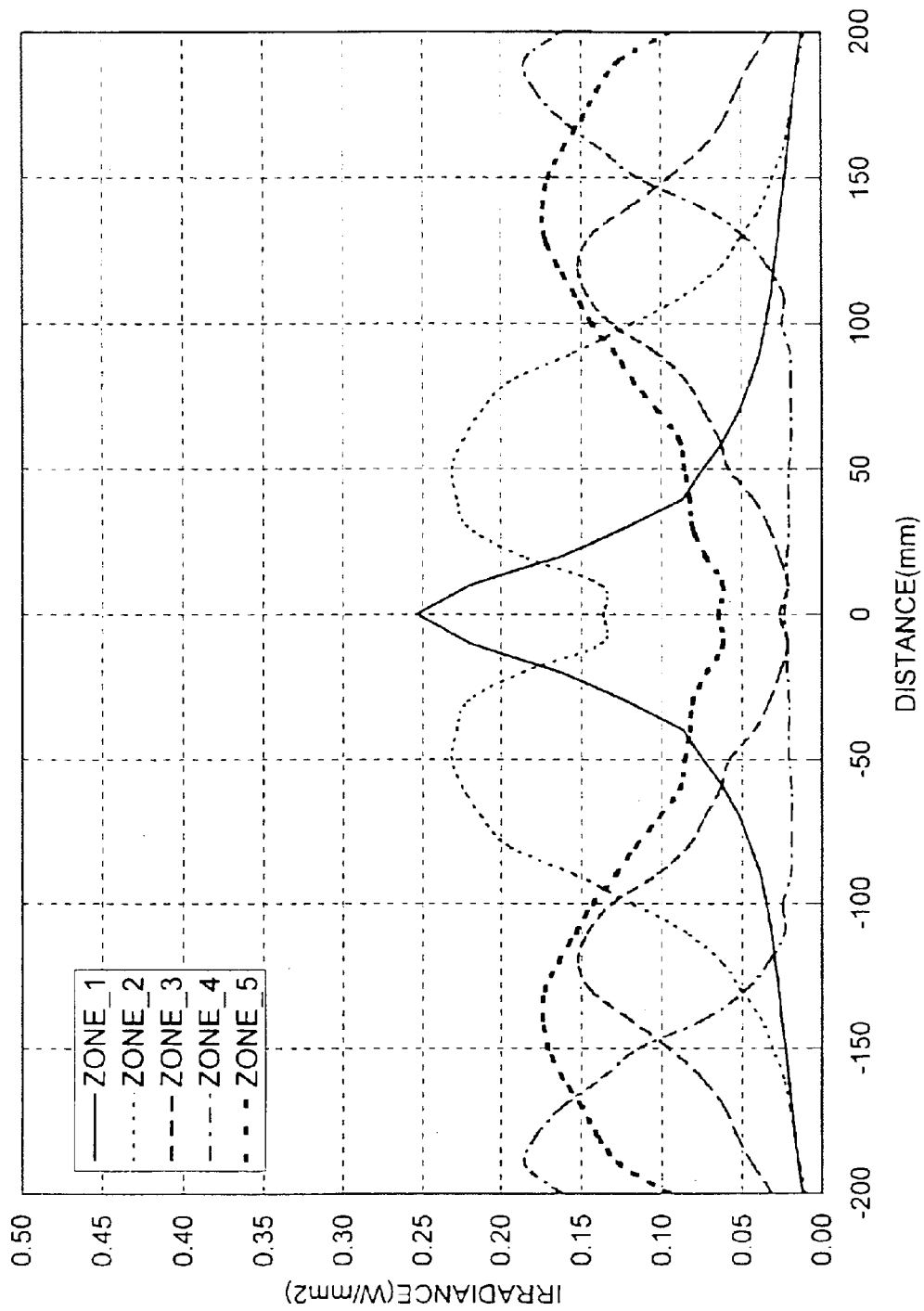

FIG. 32 is a graph showing an illumination distribution produced by synthesizing illuminance distributions of the lamps 130A corresponding to a plurality of zones (five zones in the present embodiment). In other words, the graph of FIG. 32 is produced by dividing the illuminance distribution of the 51 lamps 130A shown in FIG. 30 into five zones and synthesizing for each zone.

Further, FIG. 33 is a graph showing an illumination distribution produced by synthesizing illuminance distributions of the lamps 130A and 130B corresponding to a plurality of zones (five zones in the present embodiment). In other words, the graph of FIG. 33 is produced by dividing the illuminance distribution of the 17 lamps shown in FIG. 29 and the 51 lamps 130A shown in FIG. 30 into five zones and synthesizing for each zone.

In the present embodiment, the control part 300 sets the illuminance distribution J1 to the zone 1 and/or zone 2 and or zone 3, the illuminance distribution J2 to the zone 5 shown in FIG. 33 and the illuminance distribution J3 to the zone 4 shown in FIG. 33.

In the present embodiment, steps 1002 and 1004 are performed previously-be simulation or an initial operation, and the result is stored in a memory (not shown in the figure) connected to the control part 300. Thereby, the control part 300 can read from the memory the illuminance distribution data corresponding to a part needed to be heated when a partial heating is needed so as o use the data to a heating control. It should be noted that although the present embodiment performs a supplemental heating of the connection part W1, it can be appreciated that the present invention is applicable to a case in which a uniform heating cannot be performed due to a malfunction of a part of lamps 130. It should be noted that the process subsequent to the step 1006 will be explained in a part for explaining an operation of the heat treatment apparatus 200 described later.

The gags introducing part 180 includes a gas source, a flow adjust valve, a mass-flow controller, a gas supply nozzle and a gas supply passage interconnecting the aforementioned (not shown in the figure) so as to introduce a gas used for heat treatment into the process chamber 110. It should be noted that although the gas introducing part 180 is provided to the sidewall 112 of the process chamber 110 so as to introduce the gas into the process chamber from the side, the position of the as introducing part 180 is not limited to the side of the process chamber. For example, the gas introducing part 180 may be constituted as a showerhead, which introduces the process gas from an upper portion of the process chamber 110.

If the process to be performed in the process chamber 110 is an annealing process, the process gas includes $N_2$, Ar, etc.; if the process is an oxidation process, the process gas includes $O_2$, $H_2$, $H_2O$, $NO_2$, etc.; if the process is a nitriding process, the process gas includes $N_2$, $NH_3$, etc.; if the process is a film deposition process, the process gas includes $NH_3$, $SiH_2$, $Cl_2$, $SiH_4$, etc. It should be noted that the process gas is not limited the above-mentioned gasses. The mass-flow controller is provided for controlling a flow of the process gas. The mass-flow controller comprises a bridge circuit, an amplification circuit, a comparator control circuit, a follow adjust valve, etc. so as to control the flow adjust valve by measuring a gas flow by detecting an amount of heat transmitted from the upstream side to the downstream side in association with the gas flow. The gas supply passage uses a seamless pipe and a bite-type coupling or a metal gasket coupling so as to prevent impurities from entering the gas to be supplied. Additionally, the supply pipe is made of a corrosion resistant material so as to generation of dust particles due to dirt or corrosion on an inner surface of the supply pipe. The inner surface of the supply pipe may be coated by an insulating material such as PTFE (Teflon), PFA, polyimide, PBI, etc. Additionally, the inner surface of the supply pipe may be subjected to an electropolishing. Further, a dust particle filter may be provided to the gas supply passage.

In the present embodiment, although the exhaust part 190 is provided parallel to the gas introducing part 180, the position and the number are not limited to that shown in the figure. The exhaust part 190 is connected to a desired exhaust pump, such as a turbomolecular pump, a sputter ion pump, a getter pump, a sorption pump, a cryostat pump, together with a pressure adjust valve. It should be noted that although process chamber is maintained at a negative pressure environment in the present embodiment, such a structure is not an essential feature of the present invention. That is, for example, the process chamber may be maintained at a pressure ranging from 133 Pa to an atmospheric pressure. The exhaust part 190 has a function to exhaust helium gas before starting a subsequent heat treatment.

A description will now be given, with reference to FIG. 4, of a rotating mechanism of the object W to be processed. In order to maintain a good electric characteristic of each element in an integrated circuit and a high yield rate of products, a uniform heat treatment is required over the entirety of the surface of the wafer W. If a temperature distribution on the surface of the wafer W is uneven, the RTP apparatus 100 cannot provide a high-quality heat treatment since a thickness of a film produced by a film deposition process may vary and a slip may be generated in the wafer W due to a thermal stress. The uneven temperature distribution on the surface of the wafer W may be caused by an uneven irradiance distribution or may be caused by a process gas, which is supplied near the gas introducing part 180, absorbing heat from the surface of the wafer W. The rotating mechanism rotates the wafer W, which enables a uniform heating by the lamps 130 over the entire surface of the wafer W.

The rotating mechanism of the wafer W comprises the support ring 150, the support part 152, gears 170 and 172, a rotation base 174, a motor driver 320 and a motor 330. However, the rotating mechanism suitable for the heat treatment apparatus according to the present invention is not limited to the structure of the present embodiment, and any structures (for example, a magnetically rotating mechanism) known in the art may be used.

The support ring is connected to the support part 152 at an end thereof. If necessary, an insulating member such as quartz glass is provided between the support ring 150 and the support part 152 so as to thermally protect other members. The support part 152 according to the present embodiment is formed of an opaque quartz ring member having a hollow cylindrical shape. The support part 152 is connected to the cylindrical rotation base 174, and the gear 172 is connected to the periphery of the rotation base 174. On the other hand, the gear 170 is provided to a motor shaft 332 of the motor 330 driven by being connected to the motor driver, the gears 170 and 172 engages with each other. The motor driver 320 is controlled by the control part 300.

Consequently, when the control part 300 controls the motor driver 320 to drive the motor 330, the motor shaft 332 rotates, which rotates the gear 170, and the rotation base 174, the support part 152, the support ring 150 and the object W to be processed also rotate together with the gear 172. Although the rotation speed in the present embodiment is 90 r.p.m., the rotation speed may be determined based on a material and size of the wafer W (object to be processed) and a type and temperature of the process gas so that there is less effect of turbulence of gas within the process chamber 110 and stream of gas due to the rotation of the wafer W.

It should be noted that although the rotation mechanism is provided in the present embodiment so as to achieve a uniform heating over the entire object W to be processed, the rotating mechanism is not always necessary to achieve the uniform heating. That is, a uniform heating may be achieved without relative rotation of the lamps 130 and the object W to be processed by dividing the area of lumps 130 into a plurality of zones and appropriately controlling a power provided to the lumps corresponding to each zone.

A description will now be given of an operation of the RTP apparatus 100. First, the wafer W is carried in the process chamber 110 through a gate valve (not shown in the figure) by a conveyance arm of a cluster tool (not shown in the figure). When the conveyance arm supporting the wafer W reaches above the support ring 150, a lifter pin vertically moving system moves lifter pins (for example, three lifter pins) upward so as to protrude the lifter pins from the support ring 150 to support the wafer W. As a result, the wafer is transferred from the conveyance arm to the lifter pins, and, then, the conveyance arm returns out of the process chamber 110 through the gate valve. Thereafter, the gate valve is closed. The conveyance arm may return to a home position (not shown in the figure).

The lifter vertically moving mechanism retract the lifter pins below the surface of the support ring 150, thereby placing the wafer W on the support ring 150. The lifter pin vertically moving mechanism may use a bellows so as to maintain the a negative pressure environment in the process chamber and prevent the atmosphere inside the process chamber from flowing out of the process chamber 110 during the vertically moving operation.

The control part 300 controls the motor driver 320 so as to supply a command to drive the motor 330. In response to the command, the motor driver 320 drives the motor 330, and the motor 330 rotates the gear 170. As a result, the support part 152 rotates, and the object W to be processed rotates together with the support ring 150. Since the object W to be processed rotates, the temperature in the surface thereof is maintained uniform during a heat treatment period.

Thereafter, the control part 300 controls the lamp driver 310 so as to send an instruction to drive the lamps 130. In response to the instruction, the lamp driver 310 drives the lamps 130 so that the lamps 130 heat the wafer W at a temperature of about 800° C. The heat treatment apparatus 100 according to the present embodiment improves the directivity of the lamps 130 by the action of the lens assemblies 122 and the plated part 149 while removing the reflector, and, thereby, increasing the lamp density and consequently the power density. Thus, a desired high rate temperature rise of the wafer W can be achieved. A heat ray (radiation light) emitted by the lamps 130 is irradiated onto the surface of the wafer W by passing through the quartz window 120 so as to heat the wafer W at 800° C. with a heating rate of about 200° C./sec.

After a predetermined time has passed, the control part 300 acquires information from other radiation thermometers 200 as to whether or not the object W to be processed has been heated uniformly in response to a detection signal, which represents that the radiation thermometer 200 positioned directly under the object W to be processed detected that a temperature reached 800° C. is reached, or under other conditions. In the present embodiment, the radiation thermometer 200 directly under the connection part W1 notifies the control part 300 of a low temperature of the connection part W1. Thereby, the control part 300 determines that a supplementary heating (partial heating) is needed (step 1008 shown in FIG. 28). As mentioned above, the control part 300 determines that the supplementary heating of step 1008 is needed also in a case in which it is determined that the temperature rise of the object W to processed is not uniform due to a malfunction of a part of the lamps 130.

In the present embodiment, in order to heat the connection part W1, the control part 300 controls the lamp driver 310 so as to cause the lamp 130 corresponding to the illuminance distribution $J_3$ to be turned on or to output a higher power than other lamps 130 (step 1008). As a result, the routine returns to step 1008 if the temperature distribution of the object W to be processed is uniform, and returns to step 1006 is it is determined (in step 1012) that entire heating is needed. Additionally, is the temperature of the connection part W1 becomes higher than the center W2, the routine returns to step 1008 so that the control part 300 make a fine adjustment by using other illuminance distribution $J_1$ or $J_2$. If the control part 300 determines (in step 1012) that the heating should be ended since the object W to be processed is heated uniformly from the result of detection of each radiation thermometer 200, the control part 300 ends the heating process. As mentioned above, according to the heat treatment controlling method of the present embodiment, the object W to be processed can be uniformly and rapidly heated. The exhausting part 190 maintains the pressure inside the process chamber 110 at a negative pressure while heating or before or after the heating.

The quartz window 120 has a relatively small thickness due to the action of the lens assemblies 122, the reinforcing members 124 and the waveguiding members 126, which provides the following advantages with respect to the heating process. 1) The irradiation efficiency to the wafer W is not deteriorated since the quartz window 120 having the reduced thickness absorbs less heat. 2) A thermal stress fracture hardly occurs since the temperature difference between the front and back surfaces of the quartz plate 121 of the quartz window 120 is small. 3) In a case of a film deposition process, a deposition film and byproduct are hardly formed on the surface of the quarts window 120 since a temperature rise in the surface of the quartz window 120 is small. 4) A pressure difference between the negative pressure in the process chamber 110 and the atmospheric pressure can be maintained even if the thickness of the quartz plate 121 is small since the mechanical strength of the quartz plate 121 is increased by the lens assemblies 122.

The radiation thermometer 200 has a simple structure in which a chopper and an LED is not used, the radiation thermometer is inexpensive, which contributes to miniaturization and economization of the heat treatment apparatus 100. Additionally, the temperature measured by the method of calculating effective emissivity is accurate. An electric characteristic of an integrated circuit formed in the wafer W is deteriorated due to diffusion of impurities when the wafer W is placed under a high-temperature environment for a long time. Accordingly, a rapid heating and a rapid cooling are required, which also requires a temperature control of the wafer W. The method of calculating effective emissivity according to the preset invention satisfies such requirements. Thus, the RTP apparatus 100 can provide a high-quality heat treatment.

Thereafter, a flow-controlled process gas is introduced into the process chamber 110 from a gas introducing part (not shown in the figure). After a predetermined heat treatment is completed (For example, for 10 seconds), the control part 300 controls the lamp driver 310 to supply a command to stop heating by the lamps 130 (step 1012 shown in FIG. 28). In response to the command, the lamp driver 310 stops an operation of the lamps 130. Thereafter, the control part 300 performs a cooling process. The cooling rate is, for example, 200° C./sec.

After the heat treatment, the wafer W is carried out of the process chamber 110 by the conveyance arm of the cluster tool through the gate valve in the reverse sequence. Thereafter, if necessary, the conveyance arm conveys the wafer W to a next stage apparatus such as a film deposition apparatus.

It should be noted that the object W used in the above-mentioned embodiment is not limited to a silicon wafer, and the object W to be processed may be a III–V group compound semiconductor such as GaAs substrate or a II–IV group compound semiconductor such as a Zn—S substrate. That is, the present invention is applicable to a heat treatment apparatus for forming n-type or p-type region (well) in a semiconductor wafer by diffusing n-type impurities, such as arsenic (As), phosphorous (P)or antimony (Sb), or p-type impurities, such as boron (B) or beryllium (Be), from a surface of the compound semiconductor wafer.

Additionally, the object W used in the above-mentioned embodiments is not limited to a silicon wafer, and the object W to be processed may be a III–V group compound semiconductor substrate such as a GaAs substrate or a II–IV group compound semiconductor substrate such as a Zn—S substrate so that the compound semiconductor is subjected to ion implantation of various impurities. Especially, the present invention is preferably applicable to a heat treatment apparatus, which applies an ion implantation and diffusion process to a GaAs substrate with uniform diffusion of ions over an entire surface of the substrate and an excellent efficiency.

When the diffusion efficiencies are uniform in all the GaAs areas, the post-diffusion profile is always inclined downwards to the deep layer and in the ultimate state (well-anneal), a uniform distribution should be formed in all the depths of crystals.

The present invention is not limited to the specifically disclosed embodiments, and variations and modifications may be made without departing from the scope of the present invention.

What is claimed is:

1. A heating device for heating an object to be processed, comprising:
   a plurality of double-end lamps for heating the object to be processed so as to apply a heat treatment process to the object; and
   a plurality of reflectors for reflecting radiation heat of the double-end lamps toward the object to be processed,
   wherein each of the double-end lamps includes a rectilinear light-emitting part, and
   wherein at least two double-end lamps of the plurality of double-end lamps are arranged to have light-emitting parts that are substantially co-linear along a longitudinal direction of the light-emitting parts.

2. The heating device as claimed in claim 1, wherein the object to be processed and the double-end lamps are rotatable relative to each other so that the entire object to be processed is heated uniformly.

3. A heating device for heating to an object to be processed, comprising:
   a plurality of double-end lamps for heating the object to be processed so as to apply a heat treatment process to the object; and
   a plurality of reflectors reflecting radiation heat of the double-end lamps toward the object to be processed,
   wherein each of the double-end lamps includes a rectilinear light-emitting part and the plurality of double-end lamp are arranged so that the light-emitting parts are parallel to each other and positioned in at least two stages.

4. The heating device as claimed in claim 3, wherein the object to be processed and the double-end lamps are rotatable relative to each other so that the object to be processed is heated uniformly.

5. A heat treatment apparatus for applying a heat treatment process to an object to be processed comprising:
   a plurality of double-end lamps for heating the object to be processed so as to apply the heat treatment process to the object; and
   a plurality of reflectors for reflecting radiation heat of the double-end lamps toward the object to be processed,
   wherein each of the double-end lamps includes a rectilinear light-emitting part, and
   wherein at least two double-end lamps of the plurality of double-end lamps are arranged to have light-emitting parts that are substantially co-linear along a longitudinal direction of the light-emitting parts.

6. The heat treatment apparatus as claimed in claim 5, wherein the object to be processed and the double-end lamps are rotatable relative to each other so that the object to be processed is heated uniformly.

7. A heat treatment apparatus for applying a heat treatment process to an object to be processed, comprising:
   a plurality of double-end lamps for heating the object to be processed so as to apply the heat treatment process to the object; and
   a plurality of reflectors reflecting radiation heat of the double-end lamps toward the object to be processed,
   wherein each of the double-end lamps includes a rectilinear light-emitting part and the plurality of double-end lamps are arranged so that the light-emitting parts are parallel to each other and positioned in at least two stages.

8. The heat treatment apparatus as claimed in claim 7, wherein the object to be processed and the double-end lamps are rotatable relative to each other so that the object to be processed is heated uniformly.

9. A heat treatment apparatus comprising:
   a process chamber for accommodating an object to be processed so as to apply a heat treatment process to the object; and
   a heating unit heating the object to be processed by irradiating a radiation light onto the object to be processed, the heating unit comprises:
   a plurality of double-end lamps for heating the object to be processed so as to apply the heat treatment process to the object; and
   a plurality of reflectors reflecting radiation heat of the double-end lamps toward the object to be processed,
   wherein each of the double-end lamps includes a rectilinear light-emitting part and the plurality of double-end lamps are arranged so that the light-emitting parts are parallel to each other and positioned in at least two stages.

10. The heat treatment apparatus as claimed in claim 9, wherein the object to be processed and the double-end lamps are rotatable relative to each other so that the object to be processed is heated uniformly.

11. A heat treatment apparatus comprising:
    a process chamber for accommodating an object to be processed so as to apply a heat treatment process to the object;
    a support member supporting the object to be processed within the process chamber, the support member contacts a part of the object to be processed;
    a heating unit heating the object to be processed by irradiating a radiation light onto the object to be processed;
    a temperature measuring device measuring a temperature of the object to be processed; and
    a control unit connected to the heating unit and the temperature measuring device,
    wherein the heating unit comprises:
    a plurality of double-end lamps for heating the object to be processed; and
    a plurality of reflectors reflecting radiation heat of the double-end lamps toward the object to be processed,
    wherein each of the double-end lamps includes a rectilinear light-emitting part,
    wherein at least two double-end lamps of the plurality of double-end lamps are arranged to have light-emitting parts that are substantially co-linear along a longitudinal direction of the light-emitting parts; and
    wherein the control unit controls outputs of the double-end lamps based on a result of measurement of the temperature measuring device and an illuminance distribution characteristic produced by arbitrarily combining illuminance distributions of the double-end lamps so as to raise a temperature of the entire object uniformly.

12. The heat treatment apparatus as claimed in claim 11, wherein the object to be processed and the double-end lamps are rotatable relative to each other so that the object to be processed is heated uniformly.

13. A heat treatment apparatus comprising:
   a process chamber for accommodating an object to be processed so as to apply a heat treatment process to the object;
   a support member supporting the object to be processed within the process chamber, the support member contacts a part of the object to be processed;
   a heating unit heating the object to be processed by irradiating a radiation light onto the object to be processed;
   a temperature measuring device measuring a temperature of the object to be processed; and
   a control unit connected to the heating unit and the temperature measuring device,
   wherein the heating unit comprises:
   a plurality of double-end lamps for heating the object to be processed; and
   a plurality of reflectors reflecting radiation heat of the double-end lamps toward the object to be processed,
   wherein each of the double-end lamps includes a rectilinear light-emitting part and the plurality of double-end lamps are arranged so that the light-emitting parts are parallel to each other and positioned in two stages; and
   the control unit controls outputs of the double-end lamps based on a result of measurement of the temperature measuring device and an illuminance distribution characteristic produced by arbitrarily combining illuminance distributions of the double-end lamps so as to raise temperature of the entire object uniformly.

14. The heat treatment apparatus as claimed in claim 13, wherein the object to be processed and the double-end lamps are rotatable relative to each other so that the object to be processed is heated uniformly.

15. The heat treatment apparatus as claimed in one of claims 5–14, further comprising a quartz window located between the object to be processed and the double-end lamps, wherein the quartz window comprises a quartz plate and a lens member provided on the quartz plate, the lens member reinforcing the quartz plate and condensing a light from the heating unit toward the object to be processed.

16. The heat treatment apparatus as claimed in claim 15, wherein the lens member includes a plurality of lens elements corresponding to the double-end lamps.

17. The heat treatment apparatus as claimed in claim 15, wherein a longitudinal direction of the lens member is parallel to the longitudinal direction of the light-emitting part.

18. The heat treatment apparatus as claimed in claim 15, wherein the lens member is provided to a first surface of the quartz plate facing the double-end lamps and also to a second surface of the quartz plate opposite to the first surface.

19. The heat treatment apparatus as claimed in claim 15, wherein a reinforcing member is provided to the quartz plate so as to reinforce the quartz member.

20. The heat treatment apparatus as claimed in claim 19, wherein the reinforcing member is made of aluminum.

21. The heat treatment apparatus as claimed in claim 19, further comprising a cooling mechanism which cools the reinforcing member.

22. The heat treatment apparatus as claimed in claim 19, wherein the lens member is provided to a first surface of the quartz plate and the reinforcing member is provided to a second surface of the quartz plate opposite to the first surface.

23. The heat treatment apparatus as claimed in claim 19, wherein a plurality of reinforcing members are provided, and a quartz waveguiding member is provided between adjacent waveguiding members so as to guide a light exiting the lens member and the quartz plate to the object to be processed.

24. The heat treatment apparatus as claimed in one of claims 5–14, further comprising:
   a quartz window located between the object to be processed and the double-end lamps; and
   a reinforcing member provided to the quartz window so as to reinforce the quartz window.

25. The heat treatment apparatus as claimed in one of claims 5–14 further comprising an exhausting device connected to the process chamber so as to maintain the process chamber in depressurized state.

26. A method for controlling heat treatment applied to an object to be processed, comprising the steps of:
   producing a first illuminance distribution characteristic having a maximum at a connection part of the object contacting a support member, which supports the object to be processed, and a minimum on the object, the first illuminance distribution characteristic being produced by combining illuminance distribution characteristic of a plurality of double-end lamps included in a heating unit for heating the object to be processed;
   heating the object by the heating unit;
   detecting a temperature distribution of the object to be processed and the support member; and
   controlling outputs of the double-end lamps corresponding to the first illuminance distribution characteristic based on a result of detention of the detecting step so as to achieve a uniform temperature rise of the object to be processed.

27. The method as claimed in claim 26, wherein the producing step produces the first illuminance distribution characteristic so that the minimum is equal to or less than 0.17 W/mm$^2$.

28. The method as claimed in claim 26, wherein the producing step further produces a second illuminance distribution characteristic having a maximum on the object to be processed and a minimum at a part of the object to be processed above the support member, and the controlling step controls the outputs of the double-end lamps to the second illuminance distribution characteristic when a temperature of the connecting part of the object is different from a temperature of other parts of the object to be processed.

29. The method as claimed in claim 28, wherein the producing step further produces a third illuminance distribution characteristic having a maximum at the connection part of the object, and the controlling step controls the outputs of the double-end lamps corresponding to the third illuminance distribution characteristic.

* * * * *